United States Patent
Dreps et al.

(10) Patent No.: US 7,440,531 B2
(45) Date of Patent: Oct. 21, 2008

(54) DYNAMIC RECALIBRATION MECHANISM FOR ELASTIC INTERFACE

(75) Inventors: Daniel M. Dreps, Georgetown, TX (US); Frank D. Ferraiolo, New Windsor, NY (US); Gary A. Peterson, Rochester, MN (US); Robert J. Reese, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 11/055,865

(22) Filed: Feb. 11, 2005

(65) Prior Publication Data
US 2006/0182215 A1      Aug. 17, 2006

(51) Int. Cl.
*H04L 25/00* (2006.01)
(52) U.S. Cl. .................. 375/371; 375/372; 713/401
(58) Field of Classification Search .............. 375/372, 375/371, 354, 359; 713/400, 401, 503; 365/233
See application file for complete search history.

*Primary Examiner*—Dac V Ha
(74) *Attorney, Agent, or Firm*—Casimer K. Salys; Winstead PC

(57) ABSTRACT

A method and apparatus for de-skewing and aligning digital data received over an elastic interface bus is disclosed. Upon receiving the data, it is sent through a programmable delay line. While in the programmable delay line, the data is sampled at three points within the data's eye pattern. The three sampling points are dynamically adjusted to maximize coverage of the data's eye pattern. During the adjustment of the sampling points to optimally cover the data's eye pattern, delayed data is sampled from an alternate sampler to prevent sampling from the functional sampler while the delay in the primary sampler is adjusted. Sampling from the alternate sampler while changing the sampling points of the functional sampler serves to reduce glitches that may occur by sampling the functional sampler while its sampling parameters are changed. The method and apparatus allow for alternate eye tracking and wrap around eye tracking.

17 Claims, 25 Drawing Sheets

# DYNAMIC RECALIBRATION MECHANISM FOR ELASTIC INTERFACE

TECHNICAL FIELD

The present invention relates in general to data processing systems, and in particular, to mechanisms for communicating data between integrated circuits.

BACKGROUND INFORMATION

Modern data processing systems require the rapid transfer of data between integrated circuits ("chips"). For example, a central processing unit (CPU) transfers data to the memory system, which may include a memory controller and off-chip cache. In a multi-CPU system, data may be transferred between CPUs. As CPU speeds increase, the speed of the interface between chips (bus cycle time) becomes a limiting constraint because latencies across the interfaces may exceed the system clock period.

When data is launched from one chip to another chip, it can be launched simultaneously within numerous clock/data groups. Each clock/data group consists of multiple data bits and a clock signal, each of which travels over an individual conductor. Due to process variations and varying conductor lengths, the individual bits within a clock/data group may arrive at the receiving chip at different instances. Therefore, the individual bits of data and the clock within a clock/data group must be realigned upon arrival on the receiving chip. At the receiving end, the clock/data signals can be delayed to align the signals with respect to a sampling edge of the received clock. While it is necessary to align the individual data bits within a clock/data group at the receiving end, such delays can cause jitter and other forms of distortion. In addition to causing jitter and distortion, delaying data signals can require extensive administrative overhead and additional circuitry.

To de-skew and align the received data, the data and an associated clock signal can be sent through one or more delay lines. The delayed data signals and delayed clock signals are then used to determine the amount of de-skewing and alignment needed in the received data signal. During sampling, circuitry and logic on the receiving end adjusts delay parameters (for the clock and data signals) to optimize and properly characterize the received data signal. However, there can be a problem with sampling if the delay parameters are adjusted while sampling is taking place. Glitches in sampling data can occur due to the unsteady state of the functional sampler caused by adjusting the delay parameters during sampling.

Thus, there is a need in the art for apparatus and methods that reduce the potential for data errors associated sampling in elastic interface systems. In particular, there is a need for methods and apparatuses that provide glitchless sampling from delay lines within elastic interface receiving circuits.

SUMMARY OF THE INVENTION

The above needs are addressed by the present invention. Accordingly, in an embodiment, there is provided a method for glitchless delay value updating in an elastic interface system. The method includes sampling data off a data bus by a functional sampler. From the functional sampler, the data is loaded into a FIFO (First-In First-Out) input. Guardband characteristics are tracked using an alternate sampler. A determination is made whether a functional sample point needs to be adjusted, and if necessary the delay value for the functional sampler is adjusted. In an embodiment of the present invention, the old delay value for the functional sampler is changed to a new delay value. Changing the delay value for the functional sampler results in changing the functional sample point. The old delay value from the functional sampler is loaded into an alternate sampler. To reduce the potential for sampling glitches (data errors) the loading of data from the functional sampler into the FIFO is temporarily stopped. Data is instead loaded into the FIFO input from the alternate sampler that uses the old delay value.

An alternate embodiment of the present invention is a circuit for performing de-skewing of a plurality of data bits within a clock/data group. The circuit has a data receiver for receiving a plurality of data bits. The circuit has a programmable delay line. The programmable delay line has a functional tap and an alternate tap. The functional tap provides a functional delayed bit which substantially corresponds to one of the plurality of received data bits. The alternate tap provides an alternate delayed data bit that corresponds to one of the plurality of received data bits. The circuit has a set of level sensitive latches. The circuit has a clock receiver that is coupled to a clock generator that produces an LSSD (Level-Sensitive Scan Design) style clock for latching the set of level sensitive latches. The circuit has a functional sampler that is coupled to the programmable delay line to receive the functional delayed data bit. The functional sampler also has a functional sampler output. The circuit has an alternate sampler that is coupled to the programmable delay line to receive the alternate delayed data bit. The alternate sampler has an alternate sampler output. The circuit has a multiplexor coupled to the functional sampler to receive the functional sampler output. The multiplexor is also coupled to the alternate sampler to receive the alternate sampler output. The multiplexor outputs the functional sampler output in response to a first multiplexor control signal. The multiplexor outputs the alternate sampler output in response to a second multiplexor control signal.

An alternate embodiment of the present invention is a method for de-skewing data bits within a clock/data group. In the method, data bits that contain a plurality of original data beats are received by a delay line. A first signal is produced. The first signal corresponds to the received data bit delayed by a first delay time. A second signal is produced. The second signal corresponds to the received data bit delayed by a second delay time. A plurality of data beats from the received data signal are latched by a first sampler circuit. A plurality of second data beats from the first produced data signal are latched by a second sampler circuit. A third signal is produced at an output. The third signal corresponds selectively to either the first signal or the second signal in response to a control signal. A third signal is produced at the output that corresponds to the first produced signal while the value of the first delay time is adjusted to equal a third delay time. The third signal is temporarily produced at the output that corresponds to the second produced signal delayed by the first delay time. Thereby, the methods and apparatuses of the present invention reduce the potential for data errors associated with sampling within an elastic interface system.

The foregoing has outlined rather broadly the features and technical advantages of the present invention in order that the detailed description of the invention that follows may be better understood. Additional features and advantages of the invention will be described hereinafter which form the subject of the claims of the invention. And, yes, we will not fail to mention the spirit and scope of the invention.

BRIEF DESCRIPTION OF THE DRAWINGS

For a more complete understanding of the present invention and its advantages, refer to the following description taken in conjunction with the accompanying drawings, in which:

FIG. 11 is an example of a busy IAP pattern for use in an embodiment of the present invention;

DETAILED DESCRIPTION

Figure 1A:
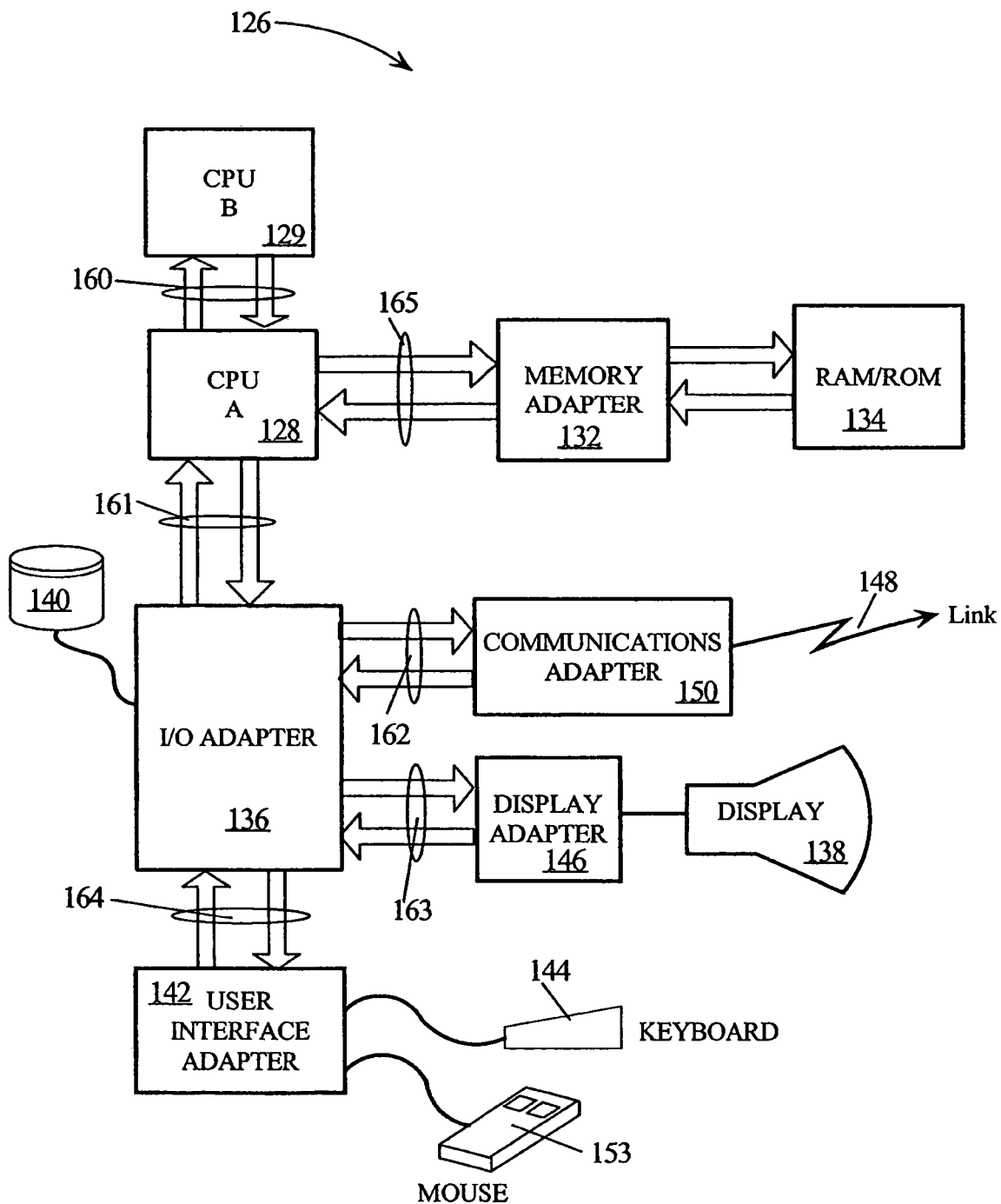
FIG. 1A is a data processing system that is a representative hardware environment for practicing the present invention.

In the following description, numerous specific details are set forth such as specific data bit lengths, ranges of delay times, and interface alignment patterns, to provide a thorough understanding of the present invention. However, it will be obvious to those skilled in the art that the present invention may be practiced without such specific details. In other instances, well-known circuits have been shown in block diagram form in order not to obscure the present invention in unnecessary detail. Some details concerning timing considerations, detection logic, and the like have been omitted inasmuch as such details are not necessary to obtain a complete understanding of the present invention and are within the skills of persons of ordinary skill in the relevant art. Refer now to the drawings wherein depicted elements are not necessarily shown to scale and like or similar elements may be designated by the same reference numeral through the several views.

FIG. 1A is a high level functional block diagram of a representative data processing system 126 suitable for practicing the present invention. Data processing system 126 includes central processing systems (CPU) 128 and 129. More than two (or a single) CPUs are possible and would be within the scope of the present invention. CPU 128 and CPU 129 are coupled with bus 160 and CPU 128 is coupled to I/O adapter 136 with bus 161 and to memory adapter 132 with bus 165. Memory adapter 132 is also coupled to read-only memory (ROM) and random access memory (RAM) in memory unit 134. System buses (e.g., 160-165) may operate in accordance with a standard bus protocol, such as the ISA protocol, compatible with CPUs 128 and 129. Among other things, the ROM in memory 132 supports storage of the BIOS (basic input output system) data and recovery code. The ROM in memory 132 may be an electronically erasable programmable ROM or other such types of read-only memory. The RAM in memory unit 134 includes, for example, DRAM (dynamic random access memory) system memory and SRAM (static random access memory) external cache. I/O adapter 136 allows for an interconnection between the devices. I/O adapter 136 is coupled to communications adapter 150 with bus 162 which may send and receive data on communications link 148. I/O adapter 136 also couples to display adapter 146 which is in turn coupled to a display 138 for displaying video and text information. I/O adapter 136 also couples to external peripherals, such as mass storage devices 140 (e.g., a hard drive, floppy drive, printer or CD/ROM drive). A peripheral device 140 is, for example, coupled to a PCI (peripheral control interface) bus, and therefore I/O adapter 136 may be a PCI bus bridge. User interface adapter 142 couples to I/O adapter 136 with bus 164 and to various user input devices, such as a keyboard 144 or mouse 153. Display 138 which may be, for example, a cathode ray tube (CRT), liquid crystal display (LCD) or similar conventional display units. Display adapter 146 may include, among other things, a conventional display controller and frame buffer memory. Communications adapter 150 may include, for example, a modem for connection to a telecom network and/or hardware and software for connecting to a computer network such as a local area network (LAN) or a wide area network (WAN). Buses 160-165 may be elastic interface buses with driver and receiver chips that de-skew and align data bits in accordance with the principles of the present invention.

The present invention can be practiced on data processing systems that use "elastic interface" buses (for example, buses 160-165, FIG. 1A) for data communication. An "elastic interface" bus consists of a number of data/address/control signals divided into "clock/data" groups. Each clock/data group consists of a reasonable number of data signals (usually single-ended) associated with a clock signal (also referred to herein as a "clock"). The clock signal may consist of a differential pair made up of a clock signal and its complement. The number of data signals associated with a clock signal can be limited to minimize the amount of skew between the data bits and the clock signal.

Figure 1B:
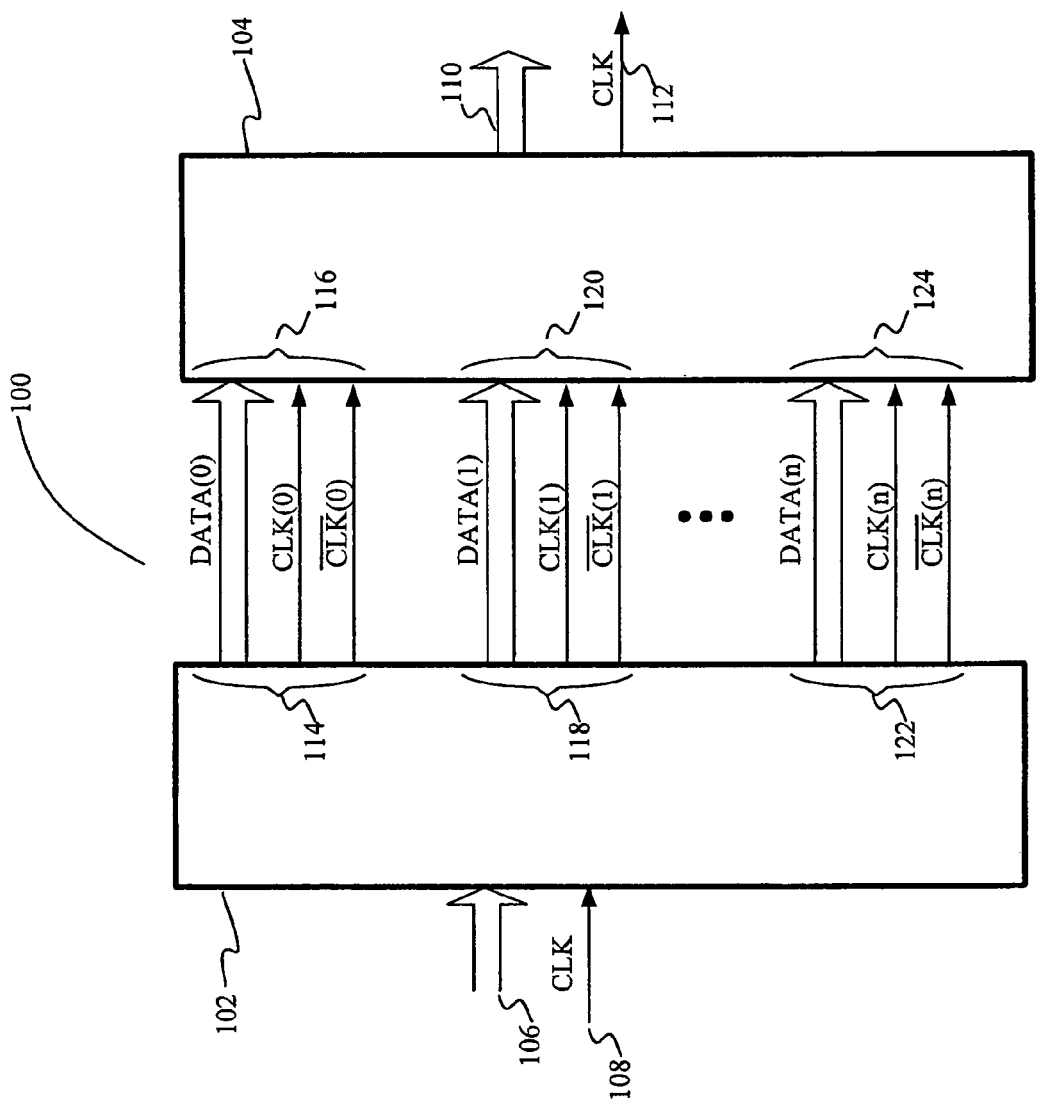
FIG. 1B illustrates, in block diagram form, a chip interface configured in accordance with an embodiment of the present invention.

FIG. 1B illustrates inter-chip communication occurring between a chip driver 102 and a receiver chip 104 over an elastic interface bus ("elastic bus") 100. The elastic bus 100 consists of a number of data, address, and control signals divided into clock/data groups. Signal 106 represents data signals transmitted to chip driver 102. Signal 110 represents data signal transmitted from receiver chip 104. Clock signal 112 represents one or more system clock signals transmitted from receiver chip 104. Clock signal 108 represents one or more system clocks transmitted to chip driver 102. Items 114, 118, and 122 represent three clock/data groups. Each clock/data group 114, 118, and 122 consists of a reasonable number of data signals (usually single-ended) associated with a clock signal. As shown in clock/data groups 114, 118, and 122, a clock signal may consist of a differential pair of clock signals. The number of data signals within the clock/data group (and associated with a clock signal) can be limited to minimize the amount of skew between the data bit and the clock signal, since a larger number of data bits entails more difficulty in wiring from driver to receiver while maintaining equal signal wire lengths and thus reasonable skew values.

During inter-chip communication, data on a driver side chip is launched simultaneously within a clock/data group across the entire bus, with both the data and clocks being precisely aligned at the driver's outputs. Standard DDR (double-data rate) driving can be utilized, in which a new beat of data is launched on both the rising and falling edges of the clock.

Data on the receiver side can arrive at varied times for each bit in a clock/data group. The difference in time of arrival between bits is commonly referred to as "per-bit skew" or "intra-clock group skew." Also, data between different clock/data groups can arrive a different times. This delay is commonly referred to as "inter-clock group skew." Within receivers that implement an elastic interface, any early data bits within a clock group are delayed, as needed, such that each received data bit's data eye is centered on the nearest clock edge. Centering each data bit's data eye on the nearest clock edge helps to ensure that data is optimally sampled into one or more latches clocked by the received clock. These sampled data can then be further delayed by one to three additional bit times, or possibly more, to de-skew all the data bits within the clock/data group to a common point.

This optimally sampled and de-skewed data for each bit can be loaded into a FIFO (First-In First-Out) buffer commonly referred to as the "elastic buffer." The depth of the FIFO buffer can vary, however, a typical FIFO buffer may be eight data beats deep. Data can then be withdrawn from the FIFO using the receiving chip's "local" clock, and forwarded to the operative portion (commonly referred to as "the guts") of the receiving chip. The FIFO for each data bit thereby allows an inter-chip communication system to compensate for variable transit times for data in different clock groups (or different buses). Clock groups or buses which have a shorter transit delay will have the data delayed for a longer time, thus allowing the data across a bus or buses to be forwarded simultaneously to the guts of the receiving chip.

In FIG. 1B, data is launched from chip driver 102 simultaneously across the entire bus, with the data and clock signals within the clock/data groups 114, 118, and 122 being precisely aligned at the output of the chip driver 102. Data arriving at receiver chip 104 can have per-bit skew due to process variations and varying lengths in conductor paths. Between different clock/data groups, additional skew may also exist (inter-clock group skew). Within the receiver chip 104, each data bit within the received clock/data groups 116, 120 and 124 has delay added in accordance with the present invention, such that each received data bit's data eye is centered on the nearest clock edge of the received clock. By centering the data eye on a nearest clock edge, the data can be optimally sampled into a latch that is clocked by the received clock. These sampled data can be further delayed by one to three additional bit times (or more, depending upon available circuitry) to de-skew all the data bits within a clock group to a common point. In other words, the sampled data is further delayed so that corresponding beats (for example, beat 0, beat 1, etc.) for each data bit align.

Figure 2:
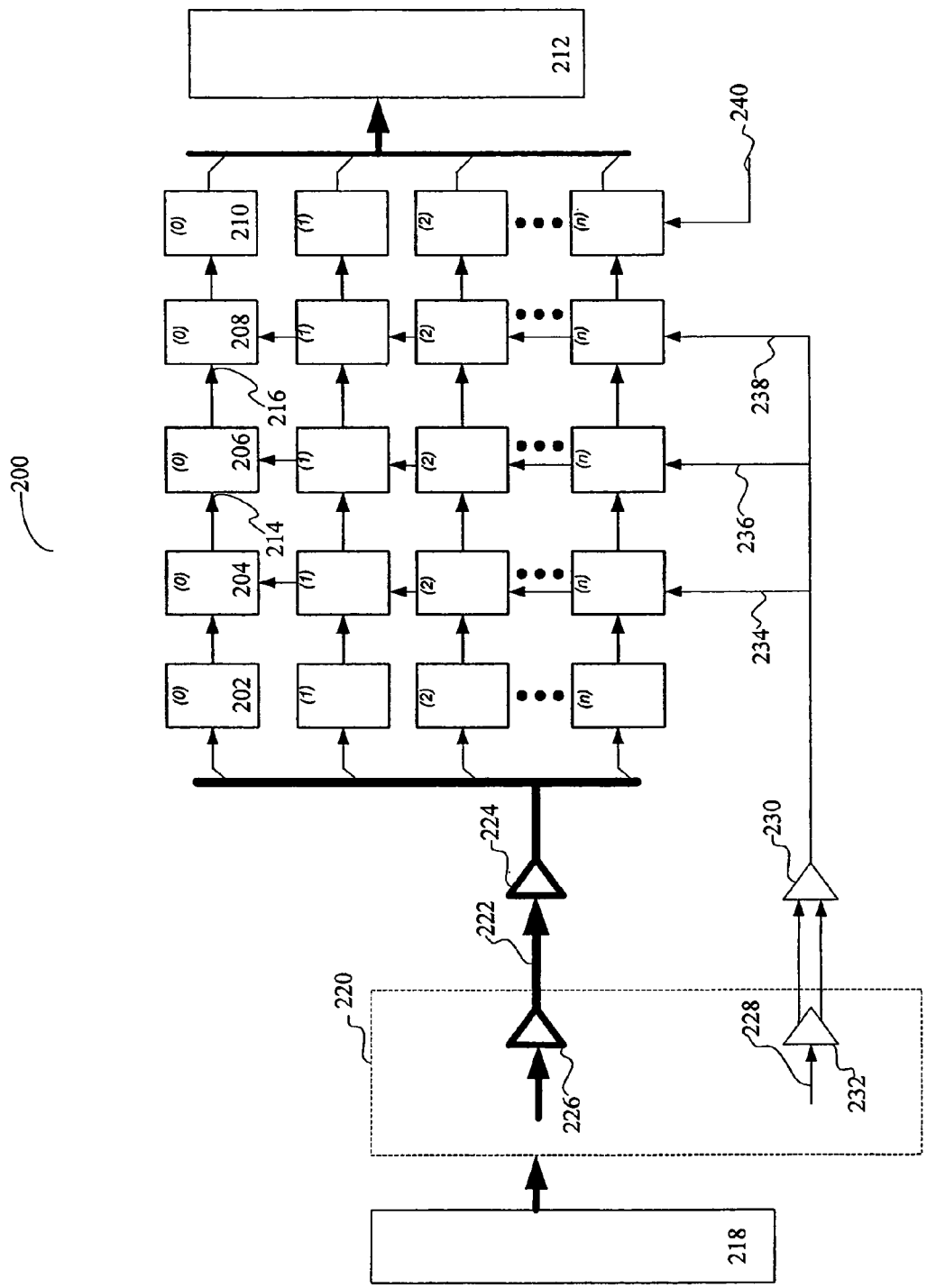
FIG. 2 represents a basic block diagram for an elastic interface clock/data group processed in accordance with an embodiment of the present invention.

Referring now to FIG. 2, block diagram 200 provides an operational overview of an elastic interface arranged in accordance with an embodiment of the present invention. Item 218 represents first chip data source on a chip driver, (for example, chip driver 102 from FIG. 1B). Item 220 represents second chip boundary latches/drivers 226 and a differential clock generator 232 coupled to clock signal 228 for launching data bits and clock signals simultaneously. On the receiving end, second chip differential clock receiver 230 is for receiving two differential clock signals from clock generator 232. Signal 240 represents one or more local clock signals on the receiving chip. Second chip data receiver 224 receives data bits on line 222. Second chip data receiver 224 and second chip differential receiver 230 may reside, for example, on the receiving chip 104 (FIG. 1B). Data lines 234, 236 and 238 distribute the received I/O clock signal from differential clock receiver 230. At a receiver chip (such as receiver chip 104 from FIG. 1B), varied amounts of transit delay result in the individual data bits received by data receiver 224 having per-bit skew. This per-bit skew among the various data bits can result in a narrowing, if not a complete elimination, of the data eye. In addition, the differential clock signals received by differential clock receiver 230 may not align properly with the data from line 222.

As shown in FIG. 2, elements 202, 204, 206, 208, and 210 all relate to de-skew and alignment of data bit #0 within a clock/data group. Likewise, the corresponding circuit elements below elements 202, 204, 206, 208, and 210 correspond to the other bits (bits #1 through #n) within the clock/data group. For the purpose of simplicity and to facilitate understanding, only data bit #0 ("bit 0")and its associated circuit elements (items 202-210) are addressed in this text.

Delay line 202 is a variable delay element that delays data bit 0 so that the center of an eye diagram made up of consecutive beats of data bit 0 is centered around the nearest edge of the received clock signal, received from differential clock receiver 230. An example of delay line 202 is shown as delay line 1400 in FIG. 14. Likewise, each of the other data bits (bits 1 through n) is aligned with the closest clock edge (rising or falling). This alignment allows optimal sampling of each bit in the middle of its data eye. Each data bit may also be delayed by 1-3 extra bit times (or more) using additional sample de-skew latches to further compensate for bit skews that are greater than one bit time. The purpose of sampling latches 204 is to de-skew a data bit so that the bit's data eyes are aligned with the nearest clock edge (rising or falling). Sampled data is transmitted from sampling latches 204 over line 214 to sample de-skew latches 206. Additional delays equal to whole bit times may be added using de-skew latches 206. From sample de-skew latches 206, sampled data is further transmitted on line 216 to FIFO latches 208. From FIFO latches 208, data is further transmitted to local latches 210 and combined with other data bits for sending to a second chip data destination 212 (the "guts" of the receiver chip). Local latches 210 are used for withdrawing data from FIFO latches 208 using the receiving chip's local clock signal 240.

Figure 3A:
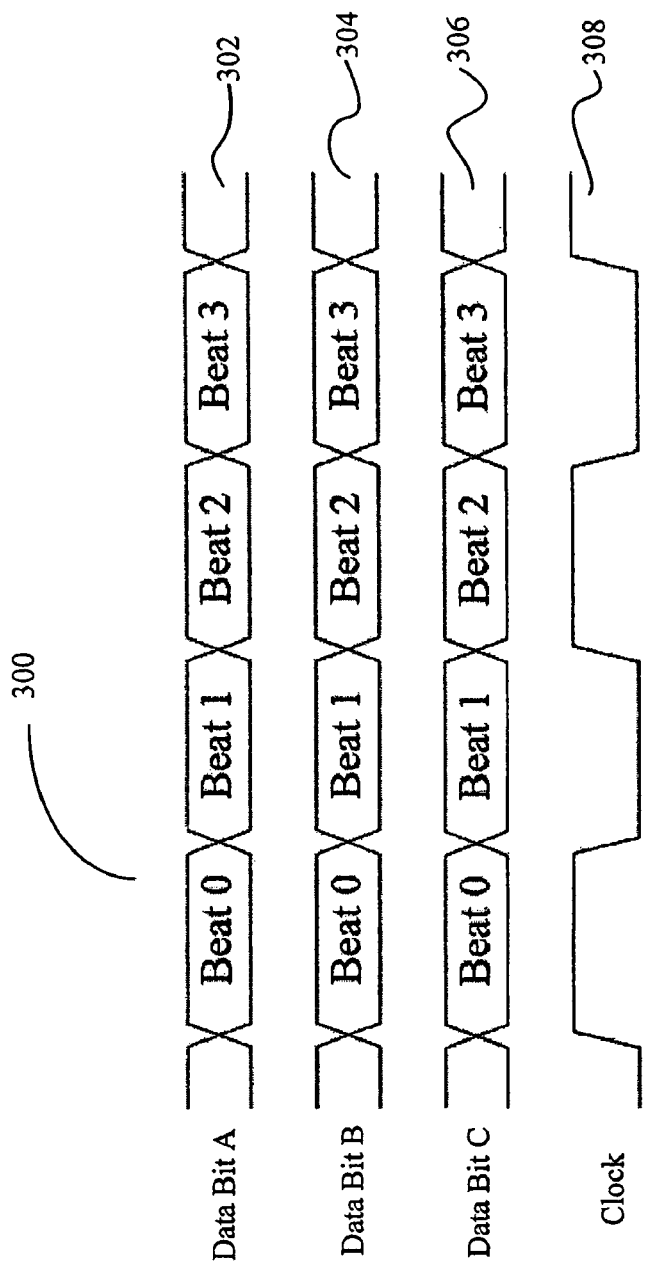
FIG. 3A is a timing diagram for a clock/data group and shows the relative timing for beats at launch time.

FIG. 3A shows a timing diagram for a clock/data group's individual data bits (Data Bit A, Data Bit B, and Data Bit C) launched from a chip driver (such as chip driver 102 from FIG. 1B) over an elastic interface to a receiver chip (such as chip receiver 104 from FIG. 1B). Though clock/data group 300 is made up of three raw data signals 302, 304, and 306, any number of data bits is possible. Clock/data group 300 has a clock signal 308, which is transmitted concomitantly with data bits 302, 304, and 306. At the source driver, raw data signals 302, 304, 306 may be edge-aligned with clock signal 308. Further, as shown, the data bits 302, 304, and 306 are launched at a double-data rate (DDR). In other words, both rising and falling edges of clock signal 308 trigger the launch of data from data bits 302, 304, 306. As a result, data bits 302, 304, and 306 are all edge-aligned with clock signal 308 upon launching from the source driver (such as chip driver 102 from FIG. 1B).

Figure 3B:
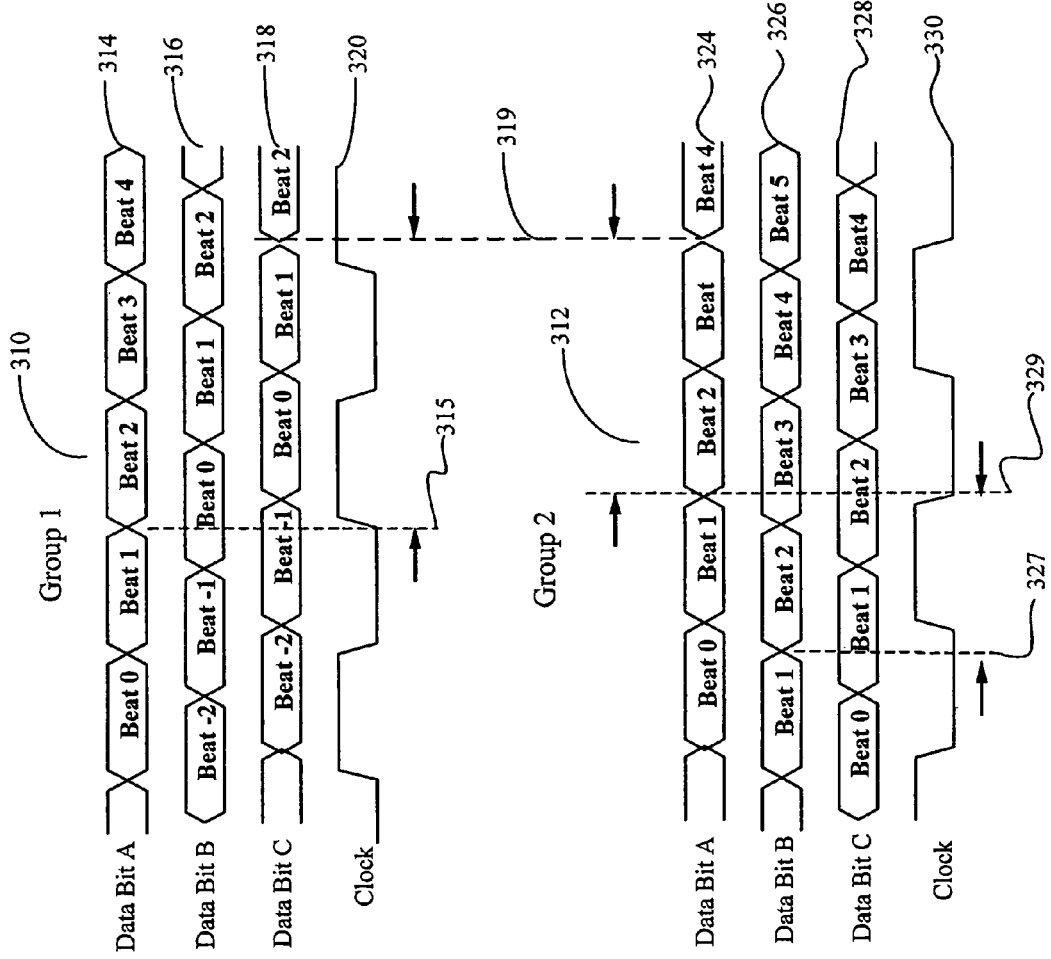
FIG. 3B is a timing diagram for two clock/data groups that are received and are in need of de-skewing and alignment in accordance with an embodiment of the present invention.

FIG. 3B shows a first clock/data group 310 received by a receiver (for example, chip receiver 104 from FIG. 1B). Clock/data group 312 is a second clock/data group that is also received by the receiver. As shown in clock/data group 310, data bit 314 reaches the receiver before data bit 318. In other words, at point 315, the receiver has received beat 1 from data bit 314; however, the receiver is receiving beat −1 from data bit 318. The receiver has not received beat 1 from data bit 318 until point 319. Accordingly, the amount of time between point 319 and point 315 is the per-bit skew between data bit 314 and data bit 318.

Also, in FIG. 3B, clock/data group 312 represents a second clock/data group sent from a source driver (such as chip driver 102 from FIG. 1B) over an elastic interface to the receiver (such as chip receiver 104 from FIG. 1B). As shown at point 329, the receiver is between beat 1 and beat 2 for data bit 324 and is receiving beat 2 from data bit 328. This indicates that in clock/group 312, data bit 328 is received before data bit 324. However, data bit 326 is the first to reach the receiver. FIG. 3B shows this because at point 329, the receiver is receiving beat 3 from data bit 326, and the receiver has not yet fully received beat 2 from either data bit 324 or data bit 328 at point 329. Therefore, to de-skew the data bits in clock/data group 312, data bit 326 must be delayed from point 327 to point 329 so that the first beats (beat 1 for each) from data bit 324 and data bit 326 are aligned at the nearest clock edge (in this case, a falling clock edge) at point 329 on clock 330. Likewise, data bit 328 will be delayed so that beat 1 is aligned with the falling clock edge at point 329. When viewed together, clock/data groups 310 and 312 show that among different clock/data groups, the same bit (for example, data bit C) can be the fastest bit (data bit 328) in one clock/data group and the slowest bit (data bit 318) in another clock/data group.

Figure 3C:
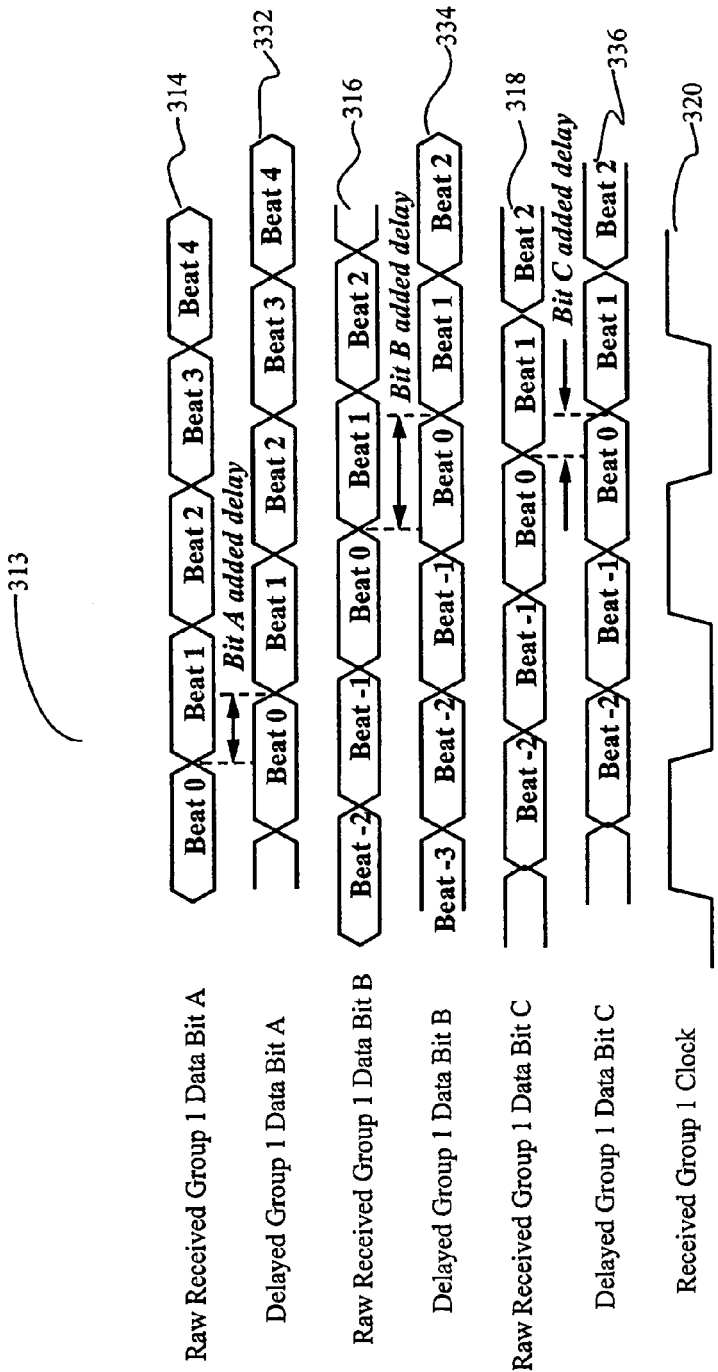
FIG. 3C is a timing diagram for clock/data Group 1 (from FIG. 3B) comparing raw received data to delayed data.
Figure 3D:
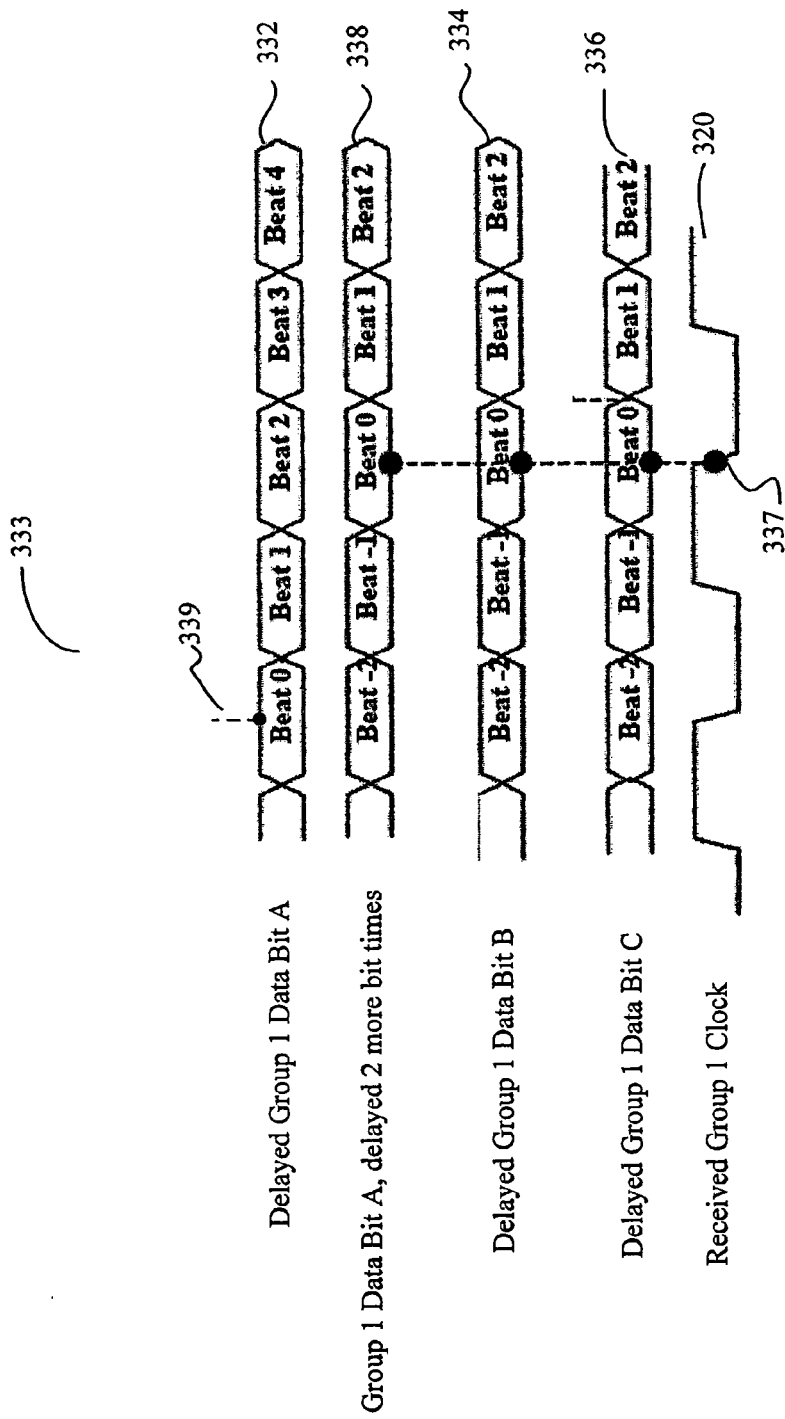
FIG. 3D is a timing diagram showing Group 1 data (from FIG. 3B) with data bit A aligned with the other bits by further delaying it by two bit times.

FIG. 3C represents timing diagram 313 for three bits within a clock/data group, such as clock/data group 310 from FIG. 3B. Timing diagram 313 shows both raw (un-delayed) data bits in addition to delayed data bits. Like-numbered data bits from FIGS. 3B and 3C correspond. Data bit 314 represents a raw, received waveform (data bit A from data clock group 1, item 310 in FIG. 3B). Data bit 332 represents data bit 314 delayed by, at most, one bit time to align the data eye centers of data bit 332 with the nearest clock edge (either rising or falling) of received clock 320. Likewise, data bit 334 represents a delayed version of data bit 316 which has been delayed to align the data eye centers of data bit 334 with the nearest clock edge (rising or falling) from received clock 320. Similarly, data bit 336 represents a delayed version of data bit 318 so that the data eye centers of data bit 336 are aligned with the nearest clock edge (rising or falling) of received clock 320. Therefore, each data bit (data bits 314, 316, 318) from clock group 1 shown as item 310 (FIG. 3B) is delayed the amount of time necessary to align its data eye centers with the nearest clock edges of received clock 320. These delays depicted and shown in FIG. 3C represent a "fine" delay (as opposed to a "gross" or "coarse" delay). Such de-skewing aligns all data bits consistently to a received clock; however, if a slow data bit is skewed by more than one bit time when compared to a faster data bit, then the receiver must further delay the faster bit by whole bit times to align corresponding beats in all data bits. FIG. 3D shows timing diagrams of data bits subjected to such further delays to align the data beats.

In FIG. 3D, timing diagram 333 represents clock/data group 1 (clock/data group 310 from FIG. 3B) after the data beats from the individual data bits (data bits 314, 316, and 318 from FIG. 3B) have been aligned to synchronize data beats 0, 1, 2 and so on. Data bit 332 must be delayed from point 339 to point 337 to align the beat 0's from each of data bits 332, 334, 336. Data bit 338 represents a further delayed version of delayed data bit 332. Because data bit 332 has already been delayed by less than one bit time as shown in FIG. 3C to align its data eyes with the nearest clock edge (rising or falling) of clock 320, data bit 338 represents a data bit which has been delayed twice—once by a fine delay and again by a gross delay. In this example, the time difference between point 337 and 339 equals two bit times. This delay of two bit times is a predictable value determined by the clock frequency. Achieving such delays can optimally be accomplished by the use of simple latches in accordance with an embodiment of the present invention. Using simple latches to delay each data bit by whole bit times results in the introduction of less jitter and noise in the received clock/data group and thereby contributes to faster bus speeds and overall system performance.

Figure 4A:
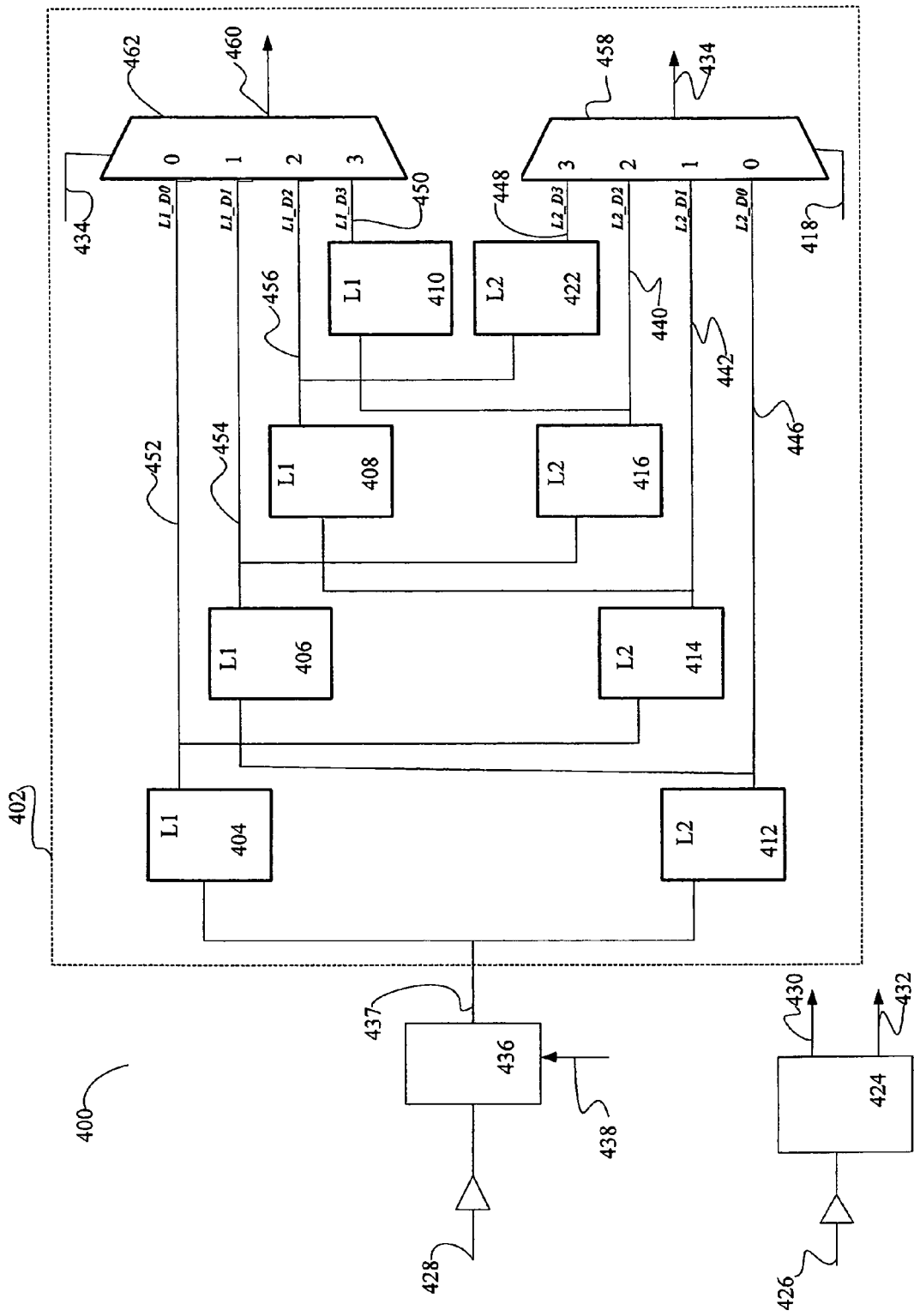
FIG. 4A is a block diagram of a functional sampler used in accordance with an embodiment of the present invention.
Figure 4B:
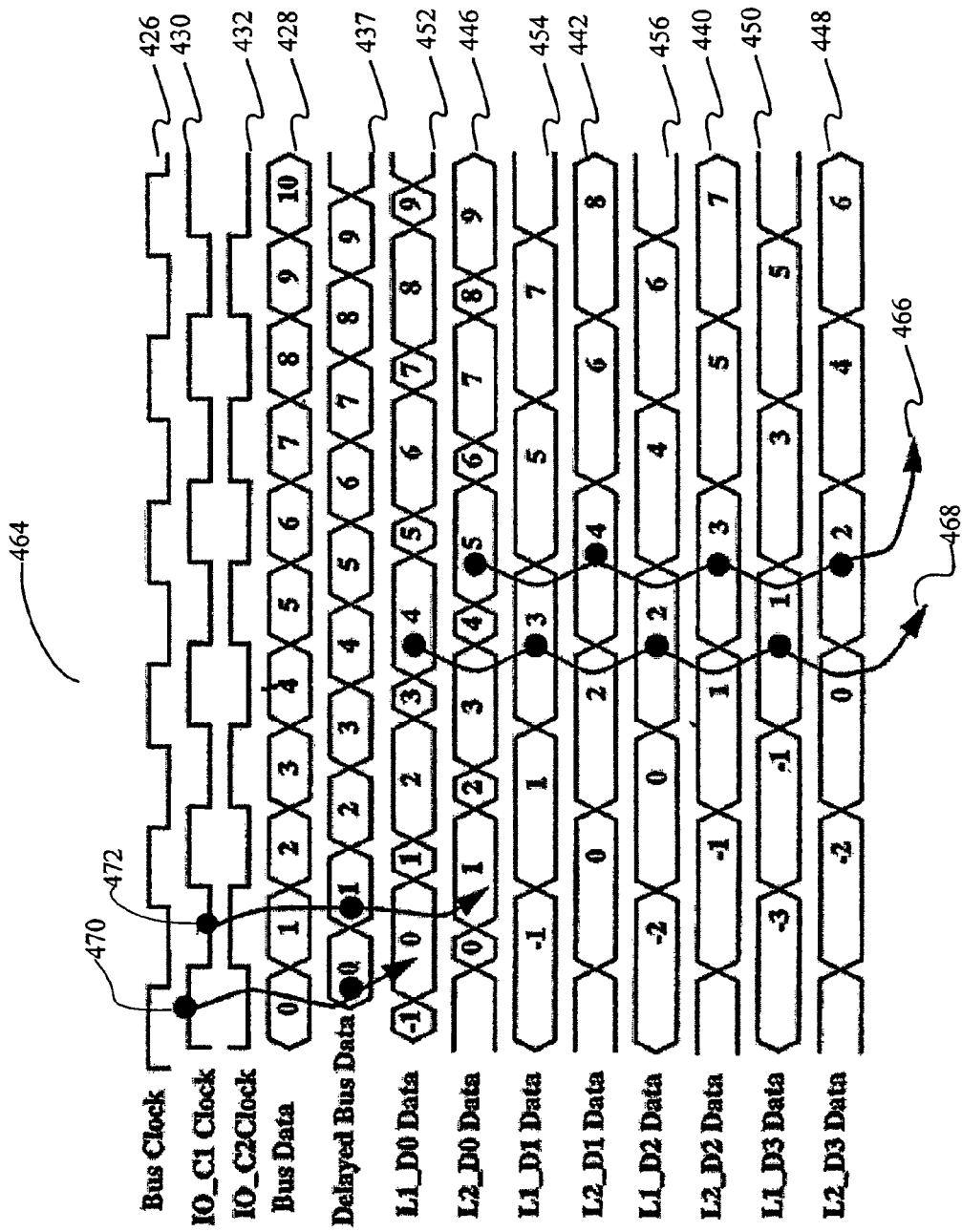
FIG. 4B is a timing diagram showing voltage levels of components from the functional sampler shown in FIG. 4A.
Figure 14:
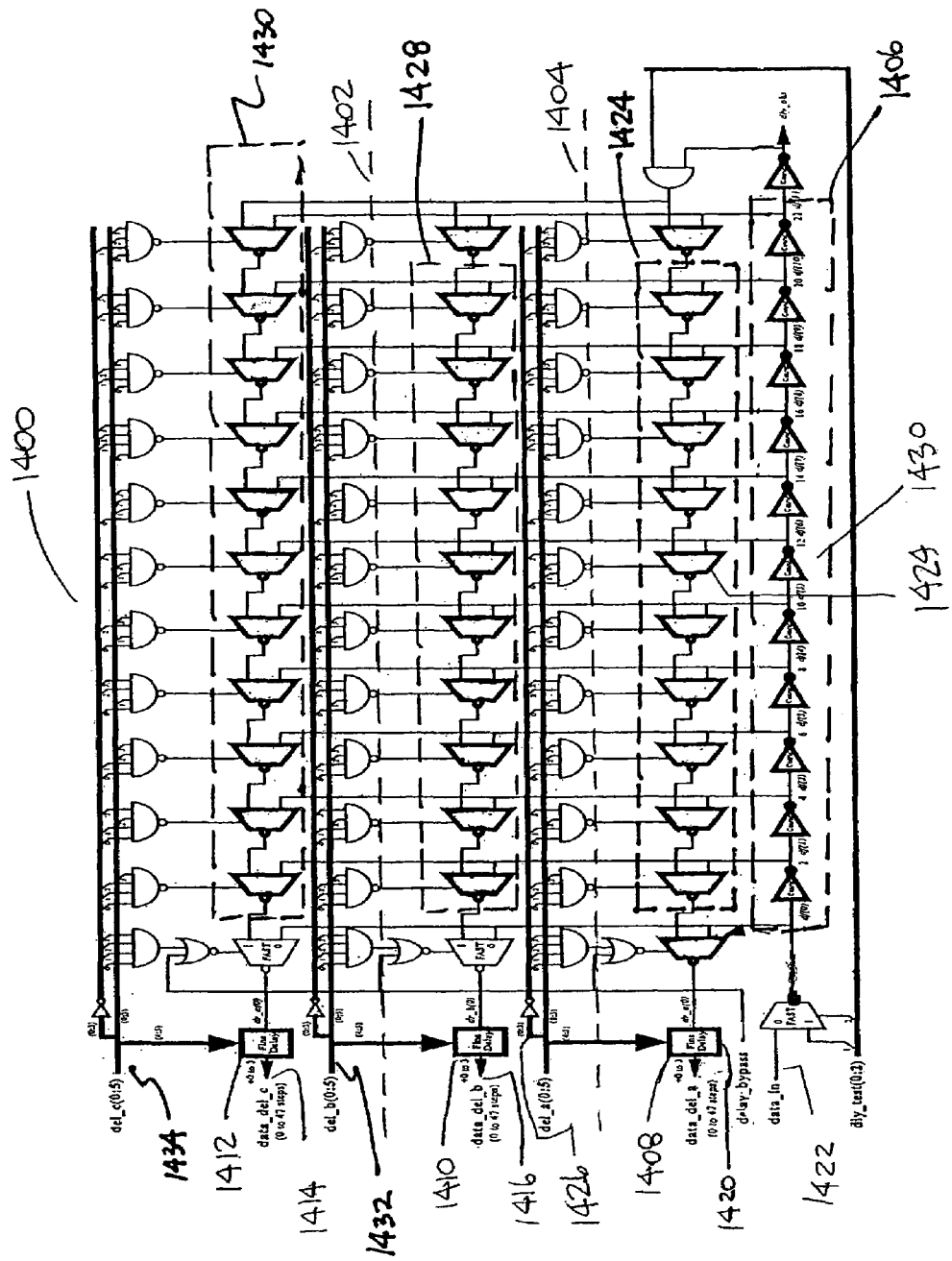
FIG. 14 is a block diagram of a 3 tap, 48-step data delay line for use in an embodiment of the present invention.

FIG. 4A illustrates a de-skewing circuit 400 for one embodiment of the present invention. The circuit 400 is used to further delay the delayed and sampled bus data by 1, 2, or 3 additional bit times. Timing diagrams for circuit 400 are shown in FIG. 4B. In the illustrated embodiment, latches 404, 406, 408, and 410 are level-sensitive, transparent latches (i.e., LSSD style/transparent latches). Likewise, L2 latches 412, 414, 416 and 422 are level-sensitive and transparent. Programmable delay line 436 receives bus data on line 428 and delays it in proportion to the delay signal 438. Delay line 436 can be implemented as shown in FIG. 14. As shown in FIG. 4, circuit 400 provides the ability to delay a delayed and sampled bus data bit by an additional 1, 2, or 3 half-clock cycles.

Referring now to FIGS. 4A and 4B together, waveform set 464 (FIG. 4B) represents waveforms of clock signals, bus signals, and data signals at various locations from the circuitry shown in FIG. 4A. For example, bus clock signal 426 is the bus clock signal coupled to the input of clock generator/splitter 424. I/O clock signal 430 is the complement of I/O clock signal 432. I/O clock signal 430 is fed to all L1 latches 404, 406, 408, and 410. Likewise, I/O clock signal 432 is fed to all L2 latches 412, 414, and 416. As shown at points 470 and 472 (FIG. 4B), the centers of consecutive beats of I/O clock signal 430 correspond to edges of delayed bus data signal 437. This is because the data beats from delayed bus data signal 437 are centered (the data eyes are centered) at rising and falling edges of clock signal 430. Bus data signal 428 represents raw bus data that is fed to the programmable delay line 436. Note that bus data signal 428 is clocked simultaneously with rising and falling edges of I/O clock signals 430 and 432. Programmable delay line 436 delays bus data signal 428, resulting in a delayed bus data signal 437.

L1_D0 data signal 452 represents the output from latch 404. Latch 404 passes the value from delayed bus signal 437 when I/O clock signal 430 is logic 1. Similarly, L2_D0 data signal 446 represents the output from latch 412. The output (L2_D0 data signal 446) from latch 412 tracks the value of delay bus data signal 437 when I/O clock signal 432 is a logic 1, and holds the value of the bus signal 437 when clock signal 432 transitions from logic 1 to logic 0, until clock signal 432 once again returns to logic 1. Latches 404 and 412 thus each capture the received input data on their corresponding clock's falling edges. Since clock 430 and 432 are complements of each other, the overall effect is that latch 404 captures data on the falling edge of clock input 426 (as logically copied to clock signal 430) while latch 412 captures data on the rising edge of clock input 426 (as logically inverted to form clock signal 432). In a similar fashion, L1_D1 data signal 454 represents the output of latch 406. L1_D1 data signal 454 tracks the output of latch 412's output, 446, when the value of I/O clock signal 430 is a logic 1 and holds the value when clock signal 430 is logic 0. L2_D1 data signal 442 is the output of latch 414 and tracks latch 404's output, 452, when I/O clock signal 432 is logic 1, and hold the value when 432 is logic 0. L1_D2 data signal 456 is the output of latch 408 and tracks the value of waveform 437 when I/O clock signal 430 is logic 1 and holds the value of bus signal 437 when clock signal 430 transitions from logic 1 to logic 0, until clock signal 430 once again returns to logic 1. L2_D2 data signal 440 is the output of latch 416 and tracks the value of latch 406 output 454 when I/O clock signal 432 is a logic 1 and holds the value when 432 is logical 0. L1_D3 data signal 450 is the output of latch 410 and tracks the value of latch 416 output 440 when I/O clock signal 430 is logic 1 and holds the value when signal 430 is logic 0. L2_D3 data signal 448 is the output of latch 422 and tracks the output of latch 408 (signal 456) when I/O clock signal 432 is logic 1 and holds the value when I/O clock signal 432 is logic 0.

As shown at point 468 in FIG. 4B, various beats from delayed bus data signal 437 are captured at various points in latching circuit 402. For example, at point 468, beat 1 is captured from L1_D3 data signal 450, beat 2 is captured from L1_D2 data signal 456, beat 3 is captured from L1_D1 data signal 454, and beat 4 is captured from L1_D0 data signal 452. Likewise, at point 466, beat 2 is captured from L2_D3 data signal 448, beat 3 is captured from L2_D2 data signal 440, beat 4 is captured from L2_D1 data signal 442, and beat 5 is captured from L2-D0 data signal 446.

As shown in FIG. 4A, MUX 462, with select input 434 and output 460, is used either to select the sampled data 452, or data sampled one bit-time earlier and delayed by one additional latch 406 (L1_D1 data signal 454), or data sampled two bit times earlier and delayed by two additional latches 414 and 408 (L1_D2 data signal 456), or data sampled three bit times earlier and delayed by three additional latches 406, 408, and 410 (L1_D3 data signal 450). Similarly, MUX 458 selects sampled and delayed data. Note that the multiplexor select inputs 434 and 418 will have, in operation, identical values such that the same amount of delay of data will occur for both MUX outputs 460 and 434. Hence, if even data beats are sampled in the first L1 sampler latch 404, odd data beats would be sampled into the first L2 sampler latch 412. Depending on whether zero, one, two, or three additional latches were added in the path into MUX outputs 460 and 434, the even data beats will appear on output 460, while the odd data beats appear on output 434, or vice-versa. Therefore, FIG. 4A shows a basic de-skewing circuit that can be employed in an elastic interface in accordance with the present invention.

Figure 5:
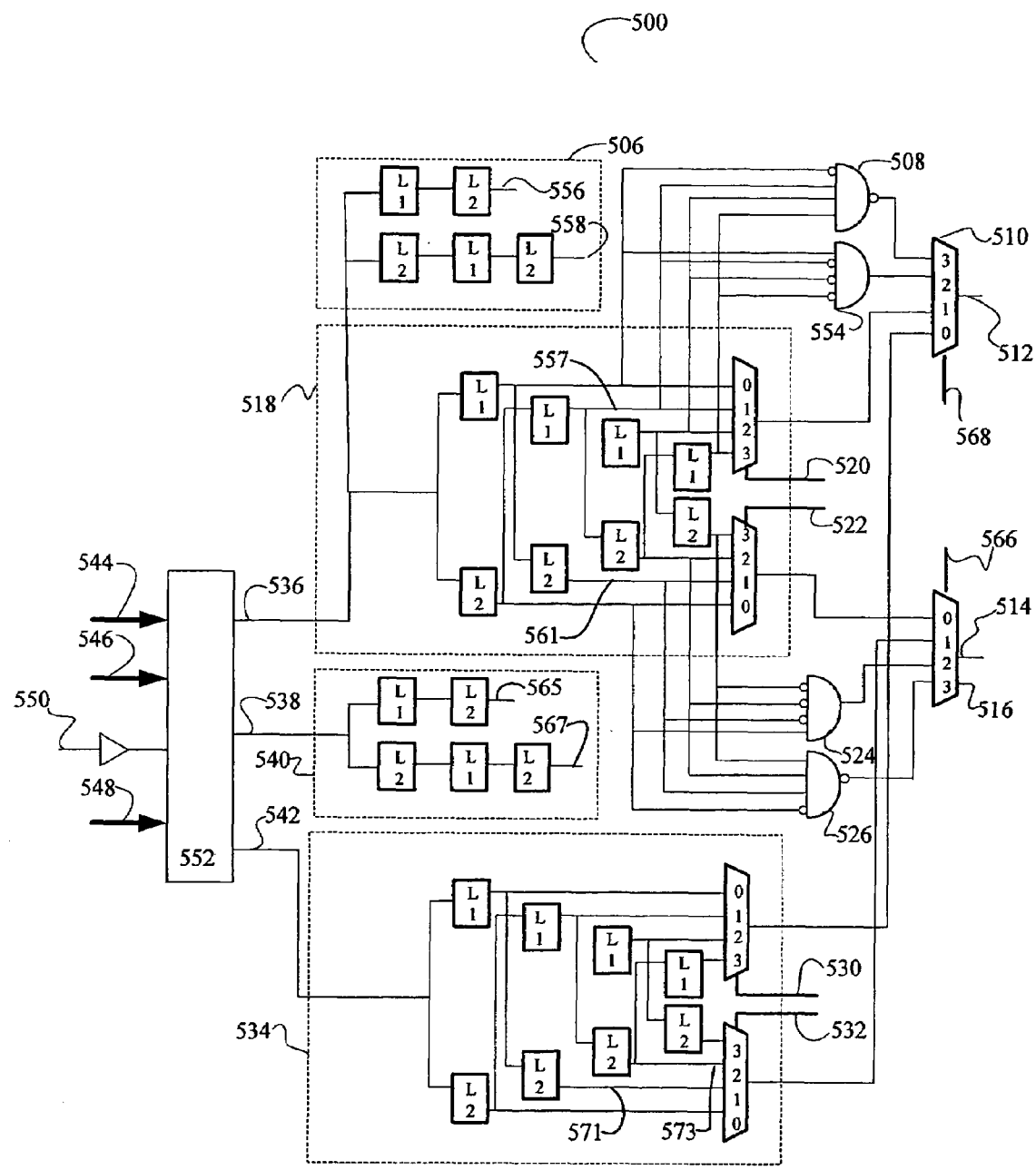
FIG. 5 is a block diagram of sampler logic for use in accordance with an embodiment of the present invention, for example, a functional data sampler, alternate data sampler, and setup and hold-time samplers.

In FIG. 5, a sampler logic 500 is shown that can be used in an embodiment of the present invention. Sampler logic 500 includes a data delay line 552. Data delay line 552 has at least three delay taps. For example, data delay line 552 has functional delay tap 536, setup delay tap 538, and alternate delay tap 542. These delay taps are controlled via multi-bit signals 544, 546 and 548. Having three delay taps allows selection via control buses of different data delay values for bus data on line 550.

Figure 10:
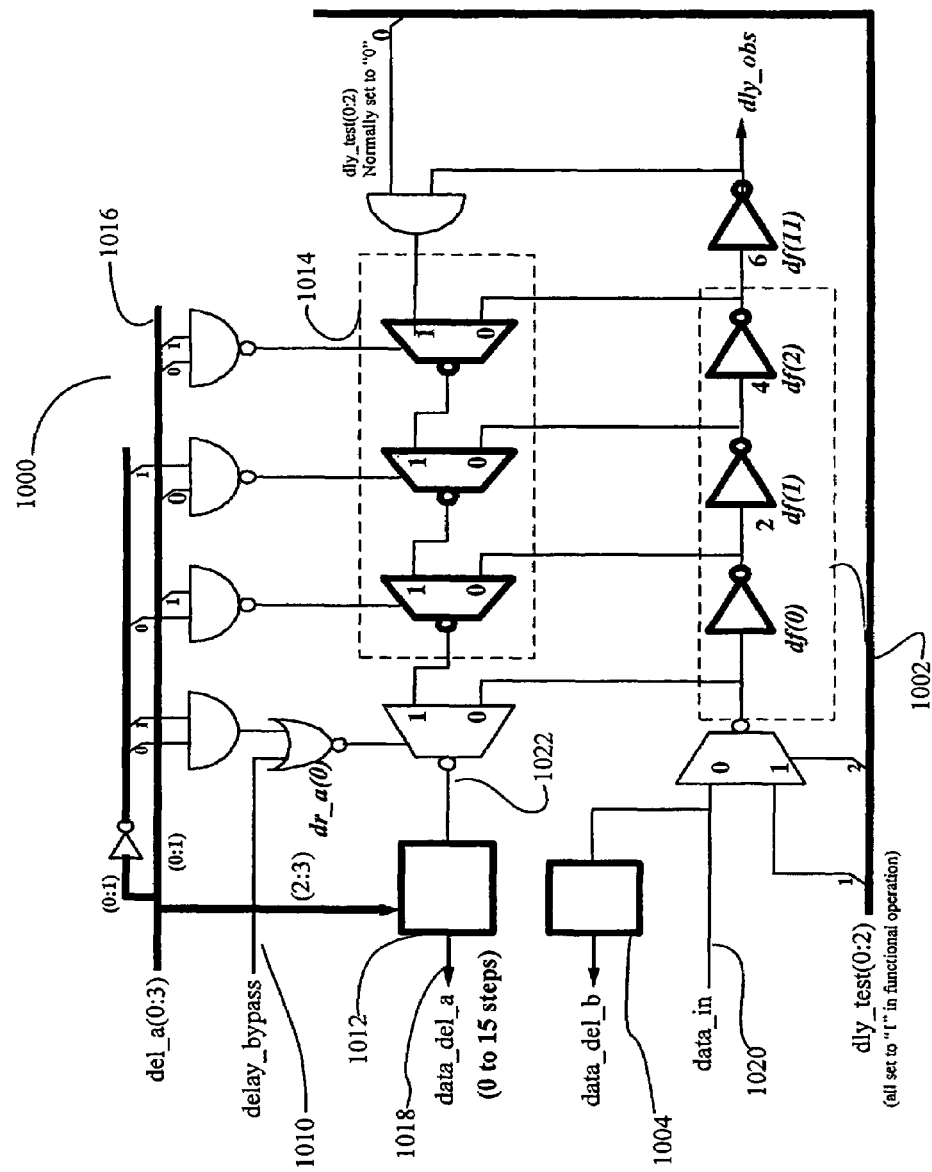
FIG. 10 is a block diagram of a guardband clock delay line with insertion delay compensation for an I/O clock for use in an embodiment of the present invention.

Refer now to FIG. 10, clock delay line 1000 is block diagram of circuitry used for delaying clock lines in accordance with an embodiment the present invention. For example, clock delay line 1000 could be used for I/O clock signal 562 and guardband clock signal 564 (FIG. 5). Clock delay line 1000 is a simplified and truncated version of a data delay line (for example, delay line 552 from FIG. 5, also delay line 1400 in FIG. 14). The signal in need of delay is input to line 1020. The input signal is then fed through coarse delay element 1002 and on to fine delay element 1012. The four delay elements (shown as four inverters) within coarse delay element 1002 provide four levels of delay. The signal in need of delay is input into line 1020. The input signal is then fed through a course delay element consisting of inverters and inverting multiplexors shown in blocks 1002 and 1014. Each inverter or inverting multiplexor shown in blocks 1002 and 1014 will add two steps of delay in the path from signal 1020 to signal 1022, which is input to block 1012. The number of these course delay inverters or multiplexors in the path is controlled by the most=significant two bits of the delay controls inputs 1016, del_a(0:1). As can be seen either zero, two, four, or six of these inverters or multiplexors can be included in the path, giving either 0, 4, 8, or 12 steps of delay from data_in signal 1020 to signal 1022. Fine delay element 1012 provides four selectable unit steps of delay, 0, 1, 2 or 3, as controlled by the least-significant two bits of the dela control input 1016, del_a(2:3). Thus, with the combination of the course delay elements of blocks 1002 and block 1014, and the fine delay element 1018, 0 to 15 delay steps can be added in the path from input 1020 to output 1018, as controlled by the four-bit control input 1016.

In addition to primary delayed output 1018, there is a second delay tap output 1004. This output has only the "insertion delay" portion of the delay line. All delay lines, as with any logic function, have delay associated with them even though the "specified delay value" is zero. This insertion delay can be sizeable for some technologies and implementations, and therefore should be compensated for. In the case of the I/O clock (for example, item 562 from FIG. 6) and the guardband clock (for example, item 564 from FIG. 6), if the clock delay line were used to delay the I/O clock, this delay (with respect to the I/O clock) would be both the desired delay value plus the insertion delay. Since there is normally a need for a precise "guardband-only" separation between the I/O clock (used to sample the functional and setup-delayed data points) and guardband I/O clock (used to sample the hold-time data point), this insertion delay must be accounted for. This can be done using the second delay tap output 1004 as the source for the sample clocks for the functional and setup latches. With this compensating insertion delay placed in the I/O clock's path, the difference between the I/O clocks and the guardband clocks is just the guardband delay value.

Referring now to FIG. 14, delay line 1400 depicts a circuit for delaying a bus bit in accordance with the embodiment of the present invention. Delay line 1400 could be used for the data delay line 552 from FIG. 5. Delay line 1400 delays data bits, and is similar to the clock delay line 100 (FIG. 10), which delays clock signals. The data bit to be delayed is input on data_in line 1422. Three separate six-bit wide delay control inputs del_a(0:5), (labeled 1426, del_b(0:5) (labeled 1432), and del_c(0:5) (labeled 1434) are used to independently control the amount of delay from data input 1422 to delayed data outputs 1420, 1416, and 1414, respectively. As with the clock delay line shown in FIG. 10, the delay function consists of course delay elements implemented with the eleven inverters shown in Block 1406 along with separate blocks of inverting multiplexors in blocks 1424, 1428, and 1430. The most-significant four bits of each of the control buses 1426, 1432, and 1434 control the amount of delays the respective delay outputs, and 0 to 44 steps of delay in 4-step increments. The least-significant two bits of each of these control buses, controlling the fine delay elements 1408, 1410, and 1412, respectively, add an additional 0 to 3 delay steps, in one-step increments. The net effect is that the data input 1422 can be independently delayed via the three control buses 1426, 1432, and 1434, such that the delayed data outputs 1420, 1416, and 1414, can each have 0 to 47 unit steps of delay. Therefore delay line 1400 is an example of a three-tap, 48-step programmable delay line for the use in an embodiment of the present invention.

Figure 6:
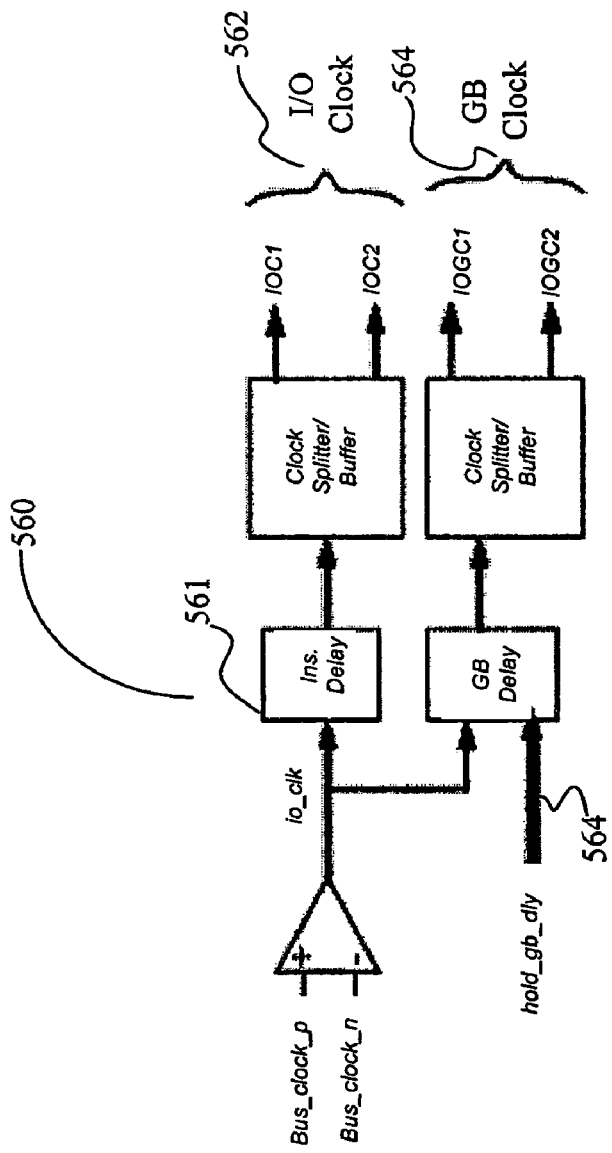
FIG. 6 is a block diagram of an example source of the I/O clock and GB clock associated with FIG. 5.

Referring now to FIG. 6, clock set 560 represents a clock delay line used to generate a normal clock (I/O clock) signal 562 and a guardband (GB) delayed clock signal 564. Each clock signal 562 and 564 represents a clock signal and its complement. The purpose of this circuit is to generate the normal sampling clock signal 562 and a clock signal that is one "guardband" delay later, GB clock signal 564. Since this later (guardband) clock is created using a variable delay line (refer to FIG. 10), and the delay line will inherently have an "insertion delay" (a fixed amount of delay even when the variable delay is set to its minimum), an equivalent insertion delay is placed in the path to generate the I/O clock. Thus, though both the I/O clock 562 signal and the GB clock signal 564 have an identical fixed amount of insertion delay added to them, the GB clock signal 564 will be a variable amount later, as determined by the value of the hold_gb_dly signal input to line 564 (FIG. 6). The ins_delay block 561 and GB_delay block 564 may be implemented using the clock delay line 1000 (FIG. 10), wherein the I/O clock is generated via output 1004 and the GB clock is generated by output 1018.

Circuitry 534 and circuitry 518 each represent basic de-skewing delay line and delay latch schemes as shown in FIG. 4A. Circuitry 518 represents a "functional sampler." In an embodiment of the present invention, functional sampler 518 uses identical logic as functional sampler 402 from FIG. 4A. Functional sampler uses functional delay tap 536 as an input. Functional latch delay signal 520 controls the output of the multiplexor receiving L1 latch signals from within functional sampler 518. Functional latch delay signal 522 controls the output of the multiplexor receiving L2 latch signals from within functional sampler 518. Output signal 557 from the L1 latch in functional sampler 518 is shown by signal 557 in FIG. 7.

Circuitry 534 represents an "alternate sampler." In an embodiment of the present invention, alternate sampler 534 uses identical logic as functional sampler 402 from FIG. 4A. Alternate sampler 534 uses alternate delay tap 542 as an input. Alternate latch delay signal 530 controls the output of the multiplexor that receives the outputs from L1 latches from within alternate sampler 534. Similarly, alternate latch delay signal 532 controls the output of the multiplexor that receives the outputs from L2 latches from within alternate sampler 534.

Circuitry 540 represents a "setup sampler." Setup sampler uses a rising edge and falling edge sampling latch structure to latch data from the setup delay tap 538 of delay line 552 (using the I/O clock 562 in FIG. 6). In operation, the setup delay input is larger than the functional delay by a "guard-band" value. Output 567 from setup sampler 540 corresponds to signal 567 in FIG. 7. Likewise, output signal 565 from setup sampler 540 corresponds to signal 565 in FIG. 7.

Circuitry 506 represents a "hold-time sampler." Hold-time sampler 506 uses a rising edge and falling edge sampling latch structure to latch data from the functional delay tap 536 of the delay line. Hold-time sampler 506 uses the guardband delayed I/O clock signal 564 (FIG. 6) to sample the functional data later than functional sampler 518. Output signal 558 (FIG. 5) is shown as signal 558 in FIG. 7. Output signal 556 (FIG. 5) is shown as signal 556 in FIG. 7.

Element 508 and element 554 represent additional combinatorial logic (logic AND functions) used to detect the first beat of data in an interface alignment pattern (IAP sequence). Multiplexer 510 is used to select from among the outputs of functional sampler 518, alternate sampler 528, or outputs of the AND functions described above. Multiplexor output 512 outputs de-skewed bits from L1 latches from functional sampler 518 and alternate sampler 528. Multiplexor output 514 outputs de-skewed bits from L2 latches in functional sampler 518 and alternate sampler 528.

Figure 7:
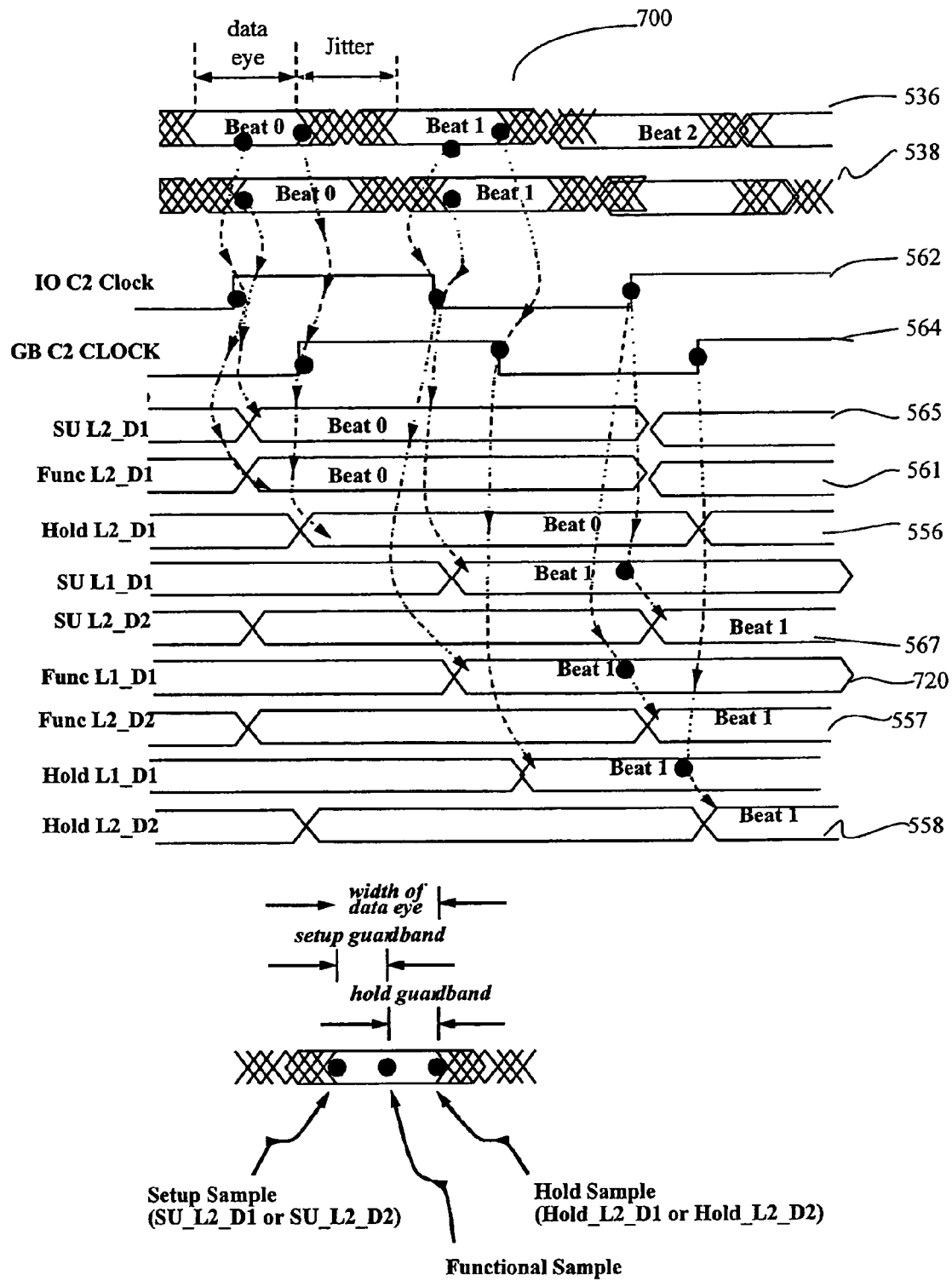
FIG. 7 is a timing diagram showing waveforms during the guardband detection operation in accordance with the embodiment of the present invention.
Figure 8:
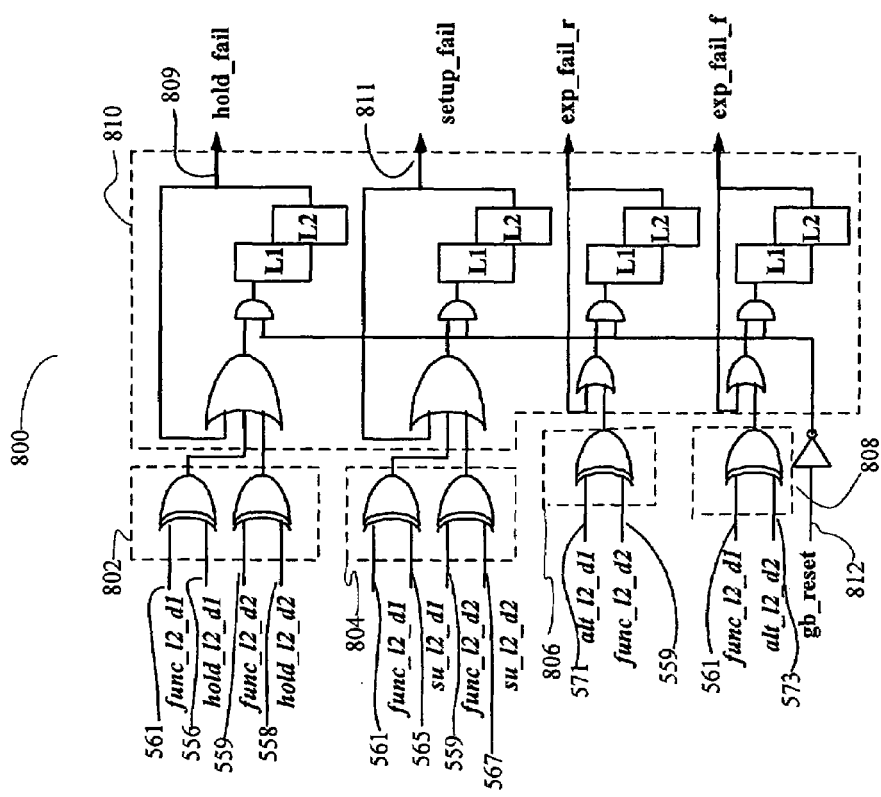
FIG. 8 is a block diagram of guardband fail capture logic.
Figure 9:
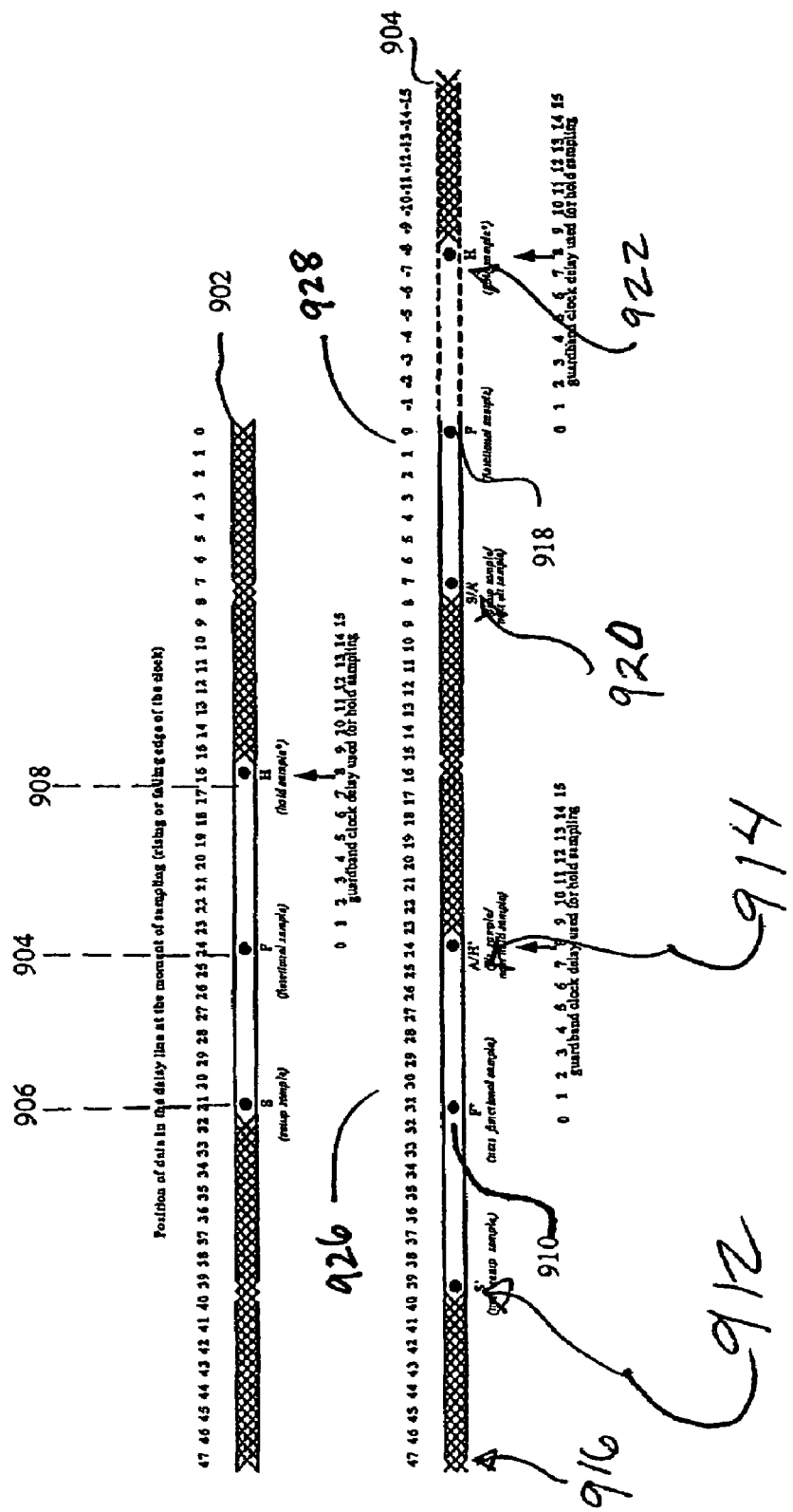
FIG. 9 is a timing diagram showing sample points over many clock cycles of sampling performed in accordance with an embodiment of the present invention.

Refer now to FIGS. 7, 8 and 9. FIG. 7 shows waveforms and associated sampling points used to achieve optimal sampling as shown in FIG. 9. FIG. 9 shows the result of accumulating data in the delay line by running a de-skewing algorithm in accordance with an embodiment of the present invention. When selecting a tap point on the delay line for sampling the data, there is generally a goal to select the tap point along the delay line to optimally meet many criteria. First, for example, the sampling point should be centered on the data eye. This assures the sampling point is as far as possible from the "noisy" edges of the data eye and therefore is less likely to sample data incorrectly when an unusual noise event occurs. Second, if more than one data eye can be sampled with the delay line, the widest data eye should be selected. This assures maximum sampling distance from any potential noise event on the bus. Third, if more than one data eye can be sampled with the delay line, and if each data eye is of roughly the same size, the smaller (earlier) sample point should be used. This minimizes the latency of data on the bus. The later sample, if used, would add one bit time of latency in capturing data off the bus. Fourth, the sampling point should be selected in order to delay the data to the closest clock data edge, if that results in sampling in the largest data eye. This is because elastic interface drivers often launch even data beats coincident with rising I/O clock edges and odd data beats on falling I/O clock edges (normal DDR bus operation) and differences in clock and data paths in chip, module, board, and connector wiring might cause the "launching" clock edge for a given beat of data to either lead or lag the arrival of the actual data by multiple bit times/clock edges. Therefore, by de-skewing the data so that it is delayed only to the closest clock edge, the amount of delay needed will at most be one bit time. This provides the advantage of a shorter delay line, which improves noise performance and lessens susceptibility to variations due to process, temperature, etc., inherent in long silicon-based paths. Furthermore, smaller delay lines require less silicon area on a chip. FIG. 7 shows waveforms of signals applied to the logic circuit 800 (FIG. 8) in accordance with an embodiment of the present invention. Like-numbered elements among FIGS. 5, 6, 7, and 8 correspond. Logic circuit 800 (FIG. 8) is used to compare a functional sample point with two "guardband" sample points, which are sampled earlier and later in the valid data window. These three sample points, when compared using the logic circuit 800, allow the alignment mechanism to detect whether a functional sample point is "centered" in the data eye and adjust the functional sample point (by selectively delaying the data with respect to the sampling clock) if a setup or hold fail occurs. The "guardband" distance from the functional sample point can also be adjusted such that the setup and hold guardband latches always sample close to the edge of the data eye.

In FIG. 7, signal 536 is from the functional data delay tap 536 in FIG. 5. Signal 538 in FIG. 7 corresponds to setup delay tap output 538 from FIG. 5. A "functional sample" is obtained by sampling waveform 536 on rising and falling edges of I/O clock signal 562 (from FIG. 6). A "hold sample" is obtained by sampling functional data delay tap 536 using guardband delayed clock signal 564 (from FIG. 6). A "setup sample" is obtained from sampling signals 538 on rising and falling edges of I/O clock signal 562.

In FIG. 7, if all three samples are equal, the functional and guardband sample points are all in the data window. However, if there is a mis-compare between the setup and functional sample points, a setup guardband fail occurs. If there is a mis-compare between the hold and functional sample points, a hold-time guardband fail occurs.

Referring now to FIGS. 5 and 8, logic circuit 800 comprises data comparators (exclusive-OR gates) 802, 804, 806, and 808 along with a "sticky" latching logic 810 which captures any instance of functional and guardband sample point mismatch over an accumulation period. Logic circuit 800 is used to determine whether sampling is occurring properly within the data eye. A signal from the control logic (GB_reset) 812 can then be asserted and negated to reset the sticky guardband latches after any delay step adjustment is made and before accumulating new guardband fails. Signal 573 (FIG. 5) is fed to comparator 808. Input 561 (FIG. 8) is coupled to output 561 (FIG. 5) from an L2 latch in the functional sampler 518 (FIG. 5). Note that input 561 is fed to exclusive-OR (XOR) gates in data comparator 804 (FIG. 8), data comparator 808 (FIG. 8), and data comparator 802 (FIG. 8). Input 556 (FIG. 8) is coupled to output 556 (FIG. 5) from the L2 latch in hold-time sampler 506 (FIG. 5). Input 559 (FIG. 8) is coupled to output 559 (FIG. 5) from an L2 latch in the functional sampler 518 (FIG. 5). Note that input 559 (FIG. 8) is coupled to exclusive-OR (XOR) gates in data comparator 802 (FIG. 8), data comparator 804 (FIG. 8), and data comparator 806 (FIG. 8). Input 565 (FIG. 8) is coupled to output 565 (FIG. 5) from an L2 latch in alternate sampler 540 (FIG. 5). Input 567 (FIG. 8) is coupled to output 567 (FIG. 5) from the L2 latch in setup sampler 540 (FIG. 5). Input 573 (FIG. 8) is coupled to output 573 (FIG. 5) from the L2 latch in alternate sampler 528 (FIG. 5). The output signals for logic circuit 800 are fed to the control logic used for optimizing the sampling of data bits. The sampling of data bits is described further in methodology 1300 shown in FIG. 13.

Refer now to FIG. 9. FIG. 9 shows graphically how two adjacent beats of data might appear along a delay line (such as delay line 552, FIG. 5) at the moment the data is sampled (i.e., on either a rising or falling clock edge.) FIG. 9 shows three samples taken within a data eye for data bit 902. Data bit 902, as shown, represents an overlay of several data beats for a data bit 902. As shown, data bit 902 has distortion and jitter that should be avoided when sampling. For data bit 902, the sample points occur at points 906, 904, and 908. When determining optimal sample points, the goals can be summarized as having one sample point in the middle of the data eye and a sample on either side of the data eye as close to the rising and falling edges as possible.

FIG. 9 shows an example using a 48-step data delay line (for example, data delay line 1400 shown in FIG. 14) and an associated 16-step hold-time clock delay line (for example, clock delay 1000 shown in FIG. 10). Waveform 902 illustrates a single data "eye" that would optimally be sampled at the delay position "24" shown at point 904. The single data eye is centered at point 904 and extends roughly from delay position "16" shown at point 908 to delay position "31" shown at point 906. If the guard-band delay value is set to 8, as shown in item 910, then the setup delay value, at position "31," will be on one edge of the data eye, and the hold-time delay, which is sampled by delaying the clock by 8 delay steps, effectively samples the data eye at the data delay time of position "16" at point 908, which is at the other edge of the data eye.

As shown by waveform 904 in FIG. 9, there also may be two (or more) data eyes within a delay line at any moment. The two data eyes shown in waveform 904 represent two adjacent data beats on the bus and are present in the delay line at the moment of sampling. The first beat of data is shown centered at data delay position "31" (item 910). The second beat of data is shown centered at data delay position "0" (point 918). Waveform 904 illustrates that the first beat of data, if sampled using tap "31" (point 910), has been delayed by an entire bit time. That same beat of data could have been sampled one bit time earlier on position "0" (point 918) by sampling one clock edge earlier. Thus, if the data were sampled on a rising clock edge # N using tap position "31" (point 910), it could also be sampled on falling clock edge N−1, using tap position "0," one bit time (31 delay positions) earlier.

As discussed above, de-skewing each data bit to the closest clock edge only partially completes the data de-skew process in many cases. As shown in FIG. 3D, different data bits (for example, signal 332 and signal 334 from FIG. 3D) in an elastic bus could be de-skewed to different clock edges than those which launched the data. Thus, as shown in FIG. 3D, some data bits, after de-skew to the closest clock edge, might have beat 0 latched one or more bit times earlier or later than other bits in the clock/data group latch beat 0 (for example signal 332 in FIG. 3D). As shown in FIG. 3D, the earlier data bit (signal 332) needs to be delayed by two bit times (resulting in signal 338, FIG. 3D) such that all beats of a clock/data group are aligned. Therefore, for aligning the bits, it is necessary to keep track of which beat of data is received at a given instant for each bit in a clock/data group.

The first task in lining up all the beats of data is to be able to identify or differentiate "beat N" of the data. Some systems identify "beat N," in part, by sending a very simple IAP training pattern (interface alignment pattern) which consists of a single '1' followed by $2^n-1$ '0's. In many systems, the repeating IAP pattern consists of either a single '1' and seven '0's, or a '1' and fifteen '0's. In such systems, it is therefore easy to detect the '1' as the first beat of the IAP pattern and align all bits to the same beat cycle. However, for elastic interface designs that operate at considerably higher data rates, very precise alignment of each bit on the bus is desirable because noise margins are critical. In order to read the IAP pattern, the signal can be fed into a FIFO for processing. The depth of the FIFO affects the length of patterns that can be recognized. An IAP training pattern can have a repeating multi-beat pattern consisting of a single '1' followed by a number N '0's, where N is a function of the receivers FIFO depth. For example, in embodiments of the present invention, a FIFO may be four, eight, or more bits deep.

For many elastic interfaces, such training patterns are used to align (de-skew) the interface and to estimate the driver-to-receiver latency (also commonly referred to as the "target time" or "target cycle"). This method of sending training patterns, in its simplicity, has some disadvantages. First, many IAP patterns have very few data transitions. Second, because there is only a single '1' in a field of '0's, there is the potential for some distortion that can cause narrowing of the lone pulsed '1' due to various circuit and transmission line related effects. A more desirable IAP pattern for high-speed elastic interface communication is "busy" and has more than one pulse. Such a busy IAP pattern can be any pattern that creates a large number of 0-to-1 and 1-to-0 transitions. Such IAP patterns give a more realistic (more like real bus data) than the "1 and $2^n-1$ '0's" patterns. Therefore, the use of busy IAP patterns aids the process of de-skewing to a closest clock edge.

In an embodiment of the present invention, the busy IAP pattern 1100 in FIG. 11 is used. IAP pattern 1100 is 64 bit times long, (numbered 0 through 63), and has a known, repeating sequence. In addition, IAP pattern 1100 has a large number of 0-to-1 and 1-to-0 transitions. Further, IAP pattern 1100 has only one occurrence of three consecutive zeros followed by a one (beats 61, 62, 63, and 0, as underlined in IAP pattern 1100). This four-beat sequence of "0001" can be detected using the sampling/delay logic shown in FIGS. 4A and 5, for example. Referring to FIG. 5, for example, this detection of the 4-beat sequence is accomplished with the AND functions implemented by items 508, 554, 524, and 526 (FIG. 5). The two different AND functions detect either a "0001" sequence or, if the bit is inverted at the driver, a "1110" sequence, the last beat of which will correspond to the first beat (beat "0") of the 64-beat IAP sequence. By selecting input "2" or "3" of the final multiplexors shown as items 510 and 516 (FIG. 5), the busy IAP pattern 1100 is converted into a simple (1 and 63 zeroes) pattern similar to "1 and $2^n-1$ '0's" used in other elastic interface designs. This methodology thereby creates an easily detected reference beat of data once in every 64 beats of data. The converted, busy IAP pattern is commonly referred to as a "modified IAP pattern." In an embodiment of the present invention, this modified IAP pattern has a single '1' followed by sixty-three '0's.

During the alignment process, a very "busy" repeating data pattern is sent over the bus. This pattern has data transitions which occur very often, with instances of data changing from 0 to 1 (or 1 to 0) every bit time, every two bit times, and every three bit times. Thus, over a short period of time (20 to 30 bit times), several instances of data changing from 1 to 0 or 0 to 1 will occur between any three adjacent data beats on the bus. Thus the data eyes, as shown in FIG. 9, along with the "noise" or fuzzy area between adjacent eyes will occur over a long sampling/guardband error accumulation period.

Figure 12A:
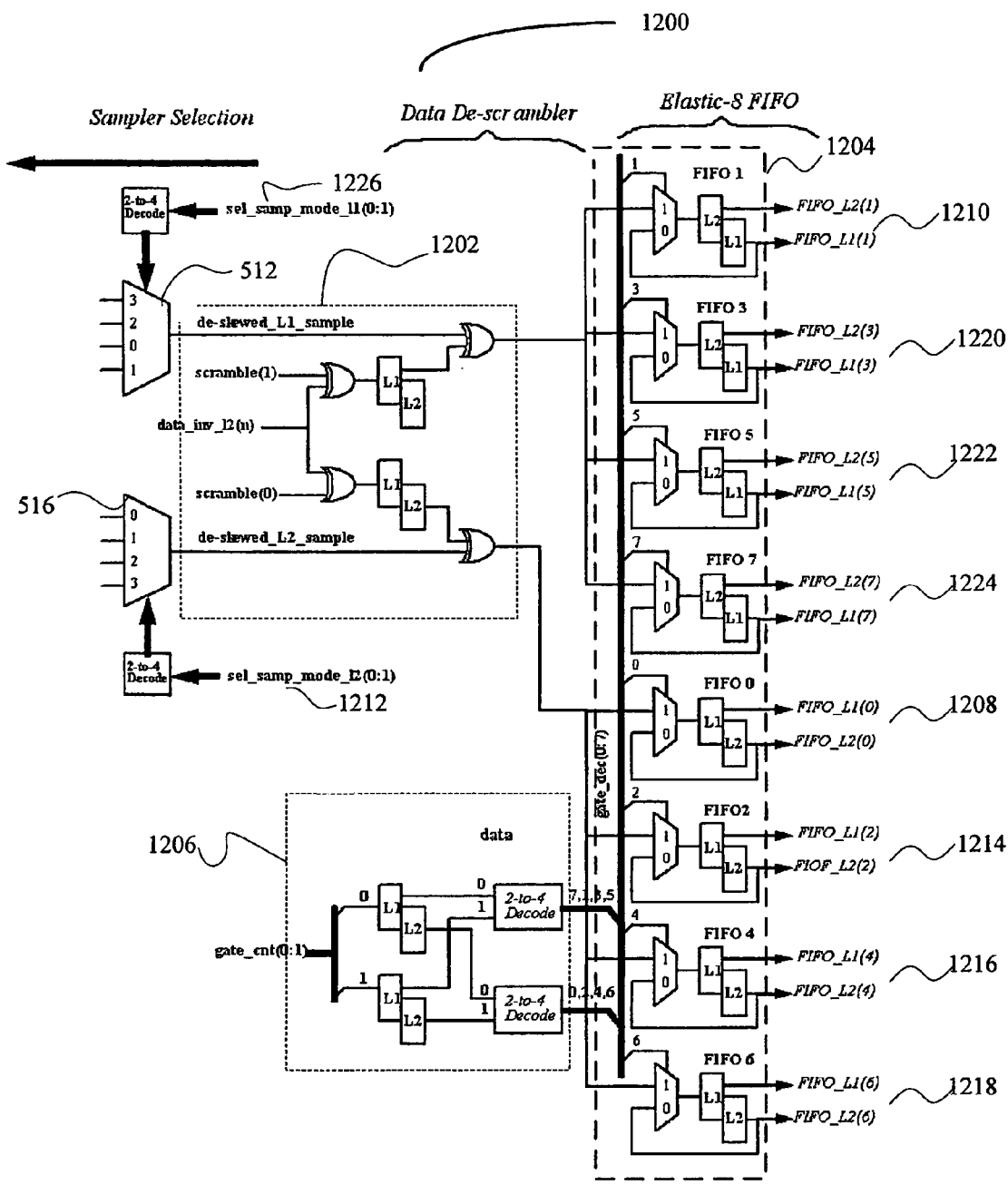
FIG. 12A is a block diagram of FIFO input logic which loads sampled and de-skewed data into FIFO latches in accordance with an embodiment of the present invention.

Referring to FIG. 12A, circuitry 1200 shows example FIFO circuitry used for processing an IAP training pattern in accordance with an embodiment of the present invention. Circuitry 1200 represents an "elastic 8" FIFO because the FIFO is 8 bits deep. Multiplexors 512 and 516 correspond to the like-numbered multiplexors in FIG. 5. In an embodiment of the present invention, circuitry 1200 also has "de-scrambling" logic shown as item 1202. This descrambling logic 1202 selectively inverts the sampled data before it is loaded into the eight FIFO latches. The eight FIFO latches are shown as item 1204 and consist of four L2-L1 latches and four L1-L2 latches which accompany the two sample/hold multiplexors 512 and 516.

Multiplexors shown in FIFO 1204 are controlled with a two-bit "gate counter" 1206 which supplies eight different phases of sample/hold signals to the L2-L1 and L1-L2 latches shown in FIFO 1204. The combination of gate counter 1206 and the sample/hold muxes allows the de-skewed L2 samples to be loaded into the even (0, 2, 4, and 6) FIFO latches, while the de-skewed L1 samples are loaded into the odd (1, 3, 5 and 7) FIFO latches, with the net effect of having sequential data beats loaded sequentially into FIFO latch 0, 1, 2, 3, 4, 5, 6, 7, and then back to 0. Thus, each beat of data is loaded into a FIFO latch, remaining there for the eight bit times (for an eight-deep FIFO) until it is written over by the next data beat. Thus FIFO latch 0 (shown as item 1208) will be loaded with data beat N, then, eight bit times later, by data beat N+8, while FIFO latch 1 (shown as item 1210) will be loaded with data beats N+1, N+9, etc. The modified IAP pattern, consisting of a single '1' and 63 '0's, when loaded into FIFO 1204, will repeatedly load the first beat of the pattern (the '1') into one of the FIFO latches, where it will remain for eight bit times. It will then be overwritten with '0's every eight bit times for the next 56 bit times, until the subsequent '1' of the repeating IAP pattern once again is loaded into that FIFO register. All other FIFO registers will be constantly reloaded with the '0's of the modified IAP pattern.

Gate counter 1206, which is used to load data into the FIFO latches in the I/O clock domain, is normally a free-running counter incremented in the I/O clock domain, and is shared across all the bits in a clock/data group. Thus all the de-skewed L1 and L2 sample data for a clock/data group are loaded into the same FIFO latch number (for example, FIFO latch 0, 1, etc., shown as items 1208 and 1210). This gate counter 1206 can be further "incremented" beyond its normal free-running count by incrementing by two instead of one for one cycle, or it can be "decremented" from its normal free-running count by not incrementing for one cycle.

Similarly, the local select counter, used to unload the FIFO into the local clock domain, is normally a free-running counter which is incremented every local clock cycle and is shared across all bits in the clock data group. Logic after this free-running counter can be used to selectively force the local select multiplexor to statically select one of the FIFO latches as input to the local latch, allowing the sticky one-detector to constantly look at the contents of a selected FIFO latch.

Therefore, the de-skewed L1 and L2 sample data must be the same data beat when loaded to and later unloaded from the FIFO latches (shown in FIFO 1204). Note further that, due to the limitations of the number of functional sampler latches, a maximum allowable skew is fixed between the earliest and latest bits (de-skewed to the closest clock edge) within a clock/data group. For the examples and embodiments discussed herein, the maximum skew between the earliest and latest bits can be three bit times. However, the examples discussed herein are not meant to limit the subject matter, as the present invention and principles of the present invention can be practiced with a greater number of functional sampler latches and associated hardware. Thus, more (or different) circuitry and logic can be implemented to allow bits with skew times of more than three bit times to be successfully de-skewed and aligned in accordance with the principles of the present invention.

Figure 12B:
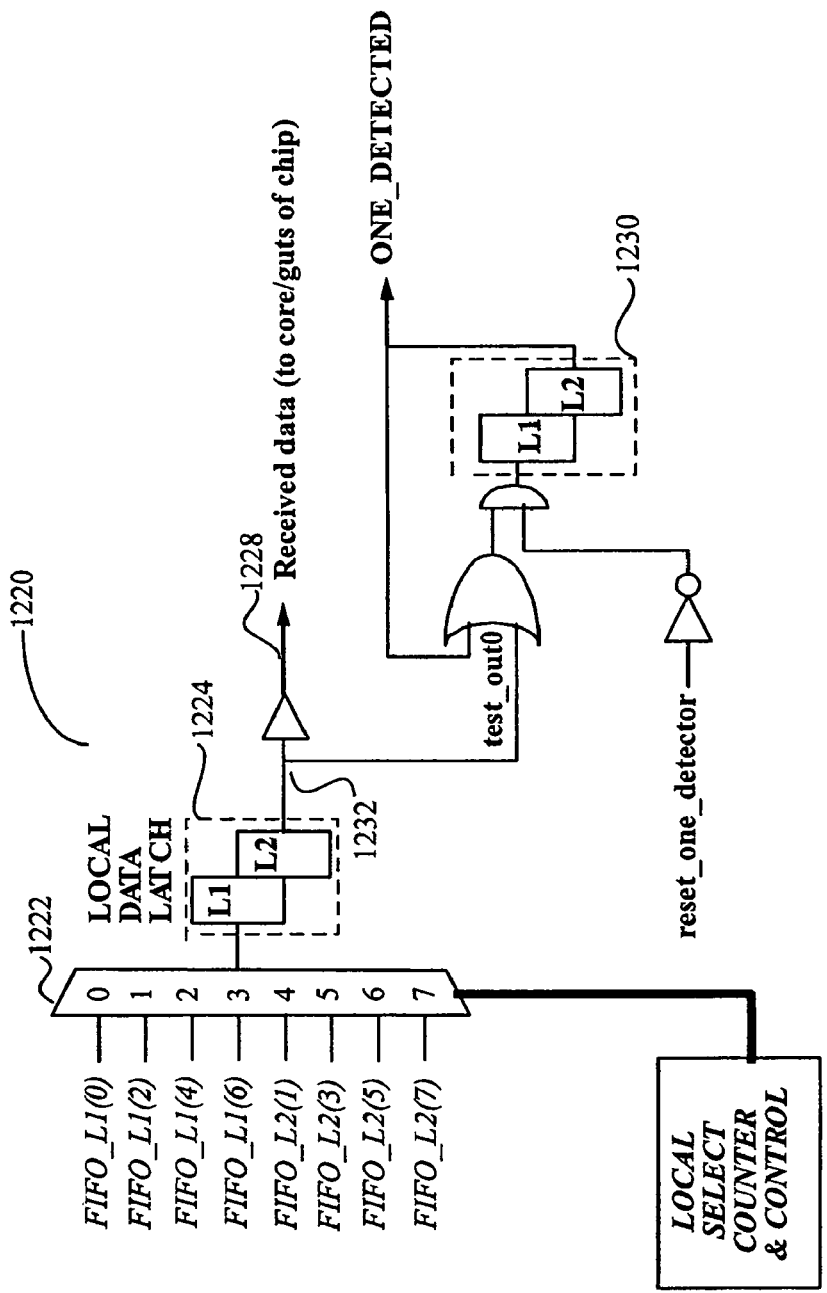
FIG. 12B is a block diagram of representative FIFO output logic for an embodiment of the present invention.

Referring to FIG. 12B, circuitry 1220 shows one example of FIFO output logic and associated local data latch for use in an embodiment of the present invention. This implementation consists of an 8-to-1 multiplexor (item 1222, used for the eight-deep FIFO shown as item 1204 from FIG. 12A) to select one of the FIFO latch outputs (from item 1204, FIG. 12A) and load it into a latch (item 1224) which is clocked in the chips internal ("local") clock domain (as opposed to the received "I/O" clock domain). In this embodiment, the local clock is running at twice the speed of the I/O clock, such that a full local clock period occurs every bit time on the bus. For functional data, the output (item 1232) of this local latch is therefore the received data which will be forwarded to the guts of the receiving chip at point 1228. During alignment, this local latch data is also input to a "sticky" latch (item 1230) which can detect if a '1' of the modified IAP pattern has occurred on the selected FIFO latched that is gated to this local data latch. The output of latch 1230 is observed by the control logic in the alignment algorithm to determine when the first beat of the modified IAP pattern has been loaded into the correct FIFO latch.

Figure 13:
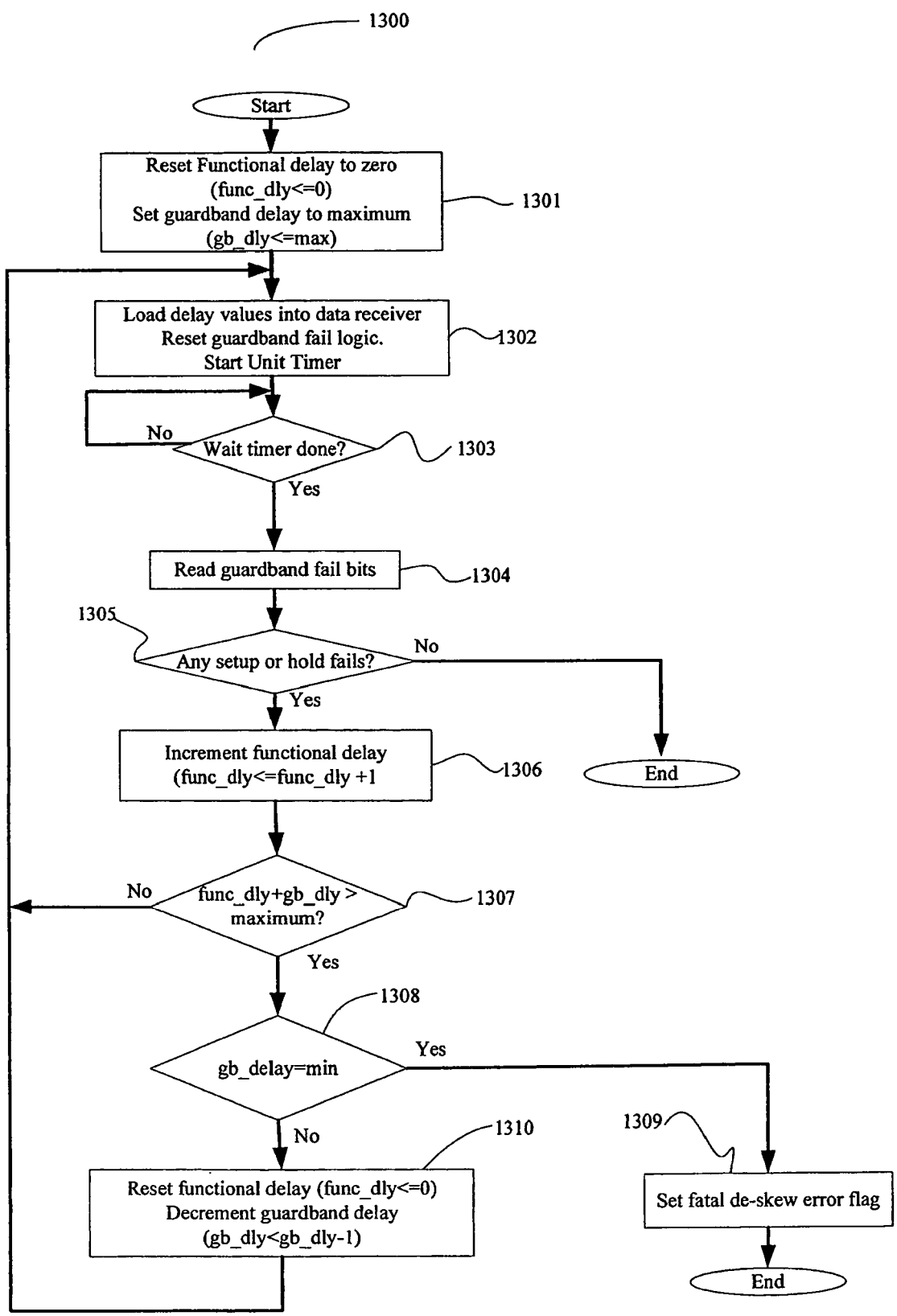
FIG. 13 a flow diagram representing a de-skew algorithm practiced in accordance with an embodiment of the present invention.

Referring now to FIG. 13, methodology 1300 illustrates representative steps taken by an embodiment of the present invention to de-skew a single bit to the closest clock edge. In step 1301, a counter for the functional delay (func_dly) is reset to zero. Also, a counter for the guardband delay (gb_dly) is set to its maximum value (in the illustrations, this is 15 delay steps). This sets the functional data sampling point to its minimum delay value of zero. The setup delay is set to the sum of the functional and guardband delay values (0+15=15, in this case). By way of example, as illustrated in FIG. 9, the functional sample occurs at point 904 for data bit 902. The guardband clock delayed signal is for determining the location of the hold sample. Initially, the hold-time guardband delay is set to the guardband value. The hold-time guardband delay serves to delay the clock signal with respect to the functional delayed data. Delaying the clock signal with respect to the functional delayed data effectively allows for sampling the functional data 15 delay steps before the functional sample point, at a delay value (with respect to the data) of negative 15.

The initial sampling points represent starting values wherein an embodiment looks for the widest possible data eye while adding the minimum amount of delay to the data path. In step 1302, these counter values are loaded into the data bit's data and guardband clock delay registers. The guardband error capture logic are reset, clearing out any fails from guardband errors set using other delay/guardband values. The guardband error capture logic consists of "sticky" latches (for example, as shown in FIG. 8) that store any instance of guardband errors (mis-compares between the functional, setup, and hold-time sample points) over a long sampling interval. A wait timer is then started. In step 1303, the wait timer allows guardband fails to accumulate over a reasonable number of bit times (typically several hundred bit times). In step 1304, the setup and hold-time fails are read from the sticky guardband fail logic registers. Referring to FIG. 8, a hold-time fail could be detected at output 809. Likewise, a setup fail could be detected at output 811. In step 1305, if there or no setup or hold-time fails, this indicates that, for the selected data eye size (two times the width of the guardband delay value), and the selected functional delay value, that the setup, functional, and hold-time samples are always equal for all the data beats during the guardband fail accumulation period. As shown in FIG. 9, the setup, functional, and hold-time samples are equal when the sample points 906, 904, and 908 yield the same value for data bit 902.

Therefore, adjusting the functional delay (func_dly) and guardband delay (gb_dly) values results in centering the sample point in the widest and earliest available data eye, and the process ends successfully. If, however, either a setup or hold-time fail (or both) occur during the fail accumulation "wait" period, it indicates that either the functional, setup, or hold-time sample points are not properly positioned within the data eye. Referring to the data bit 902 in FIG. 9, a setup fail would occur if point 906 occurred outside the data eye, to the left of its current position as shown. Likewise, a hold-time fail would occur for data bit 902 if point 908 occurred outside the data eye, to the right of its current position as shown. If either such setup failure occurs, the process continues to step 1306.

In step 1306, with the previous functional and guardband delay values, the guardband checking produced one or more fails. Therefore, the functional delay counter is incremented (while keeping the guardband delay value at its previous value). This effectively moves the three sampling points (setup, functional, and effective hold-time sample points) up by one delay step, such that a search for the same width of data eye can occur further down the delay line (later in time by one delay step value). In step 1307, the setup delay point is limited to the length of the data delay line, and since the functional delay line is one guardband delay less that the setup delay point (setup_dly=func_dly+gb_dly), if the new functional delay value plus guardband is less than the delay line length, that new functional delay value can be checked by going back to step 1302 for guardband checking. If, however, this setup delay point is greater than the maximum value of the delay line (greater than 47 for the example shown in FIG. 9), then it can be concluded that, for the given guardband delay, there is no functional delay value for which a data eye can be found along the delay line which is less than 2 times the guardband delay wide, and the process continues to step 1308. In step 1308, the guardband delay, (gb_dly), represents, in delay increments, one-half the width of the data eye. If this data eye is smaller than a pre-determined minimally acceptable value (2×"min" or 1×gb_dly), it indicates that the data is too noisy for acceptable data transfer, and the process goes to step 1309. If, however, this data eye is not below the acceptable minimum, the process continues to step 1310. In step 1309, if the data eye is too small for reliable operation, a de-skew error is posted to the system control logic and the process ends with an alignment failure. The process arrives at step 1310 when, for a given guardband delay value (given data eye size), there is no functional delay value across the delay line for which a data eye can be found. In step 1310, the functional delay value is reset to its initial value of 0, and the guardband delay decremented by one, with the searching process then continuing at step 1302.

Methodology 1300 shows that, to optimize sampling, the process searches for a larger data eye than actually exists. Therefore, the process then decrements the guardband delay (thereby looking for the next-smallest possible data eye) and resets the functional delay value to zero (thereby looking for the smallest functional sample point using that smaller data eye search criteria). These new values are then used in a new search starting back at step 1302. In summary, the algorithm 1300 for de-skewing data to the closest clock edge, as described above, selects an optimal sample point while using a minimal amount of silicon delay and associated noise/variability disadvantages.

Referring back to FIG. 12A, other representative steps of an embodied method are described for completing the de-skew by adding sampling latches. First, the sel_samp_mode MUX controls, shown as items 1212 and 1226, are set to select the AND function outputs, which thereby gates the "one '1' and sixty-three '0's" alignment pattern into the FIFO input logic. Note that for each bit, this '1' of the IAP pattern has been de-skewed to the closest clock edge, but the '1' is from the first sample latch and thus has not had any additional bit times of de-skew added. Second, this '1' of the IAP pattern will be loaded into one of the FIFO latches, as determined by the gate count at the time that bits '1' of the modified IAP pattern is on the de-skewed L1 or L2 sample. If that '1' for a bit has been de-skewed to be captured on the rising edge of the I/O clock, it will be on the de-skewed L2 sample and therefore loaded into one of the "even" FIFO latches, shown as items 1208, 1214, 1216, and 1218. Similarly, if that '1' for a bit has been de-skewed to be captured on a falling edge of the I/O clock, it will be on the de-skewed L1 sample and therefore be loaded into one of the "odd" FIFO latches, shown as items 1210, 1220, 1222, and 1224. Third, since the skew between the de-skewed-to-closest-clock-edge data must be no more that three bit times (in this example, which is the skew limitation defined for the bus in this elastic interface implementation) apart across an entire clock/data group, the '1' of the IAP pattern will be loaded, at worst, into four adjacent latch of the FIFO. For instance, the earliest data bit might arrive at the FIFO inputs when the gate counter is selecting FIFO 2 (shown as item 1214) to be loaded (from de-skewed L2 sample), and thus will be loaded there, while the latest bit on the bus might be sampled three bit times later and be loaded into the FIFO when the gate counter is selected FIFO 5 (shown as item 1222) to be loaded (from the de-skewed L1 sample). Bits, if any, between the earliest and latest bits, will be loaded in between, in either FIFO latch 3 or 4 (shown as item 1220 and 1216, respectively). The other FIFO latches (in this case 6, 7, 0 and 1 in an eight-deep FIFO) should contain all '0's. If the other FIFO latches do not contain all '0's, then it is likely that the data on the bus is too skewed to be properly de-skewed, and the bus is broken and possibly un-alignable. Fourth, by forcing the local select MUX to a fixed value, the local latch will be loaded with the contents of only one FIFO latch. Thus, using the sticky '1's detect logic, one FIFO latch can be sampled for at least one IAP pattern period (64 bit times), and if data in that FIFO ever has the '1' (first beat of the IAP pattern) loaded into it, the "one detected" signal will be set. Each FIFO latch can then be checked for '1's of the IAP pattern and the "latest" bit easily determined. Fifth, whichever FIFO latch the latest bit in the clock/data group is loaded into, this location can then be changed by incrementing or decrementing the gate counter (which determines which FIFO latch is loaded) beyond its normally-incrementing value. Thus, if the latest bit were loaded into FIFO latch 4 (shown as item 16), by decrementing the gate counter by two, this same data beat will be loaded into FIFO latch 0 (shown as item 1208). Since the gate counter is shared across all bits on the bus, earlier data bits will consequently be loaded into four-earlier FIFO latches. For the rest of the interface alignment procedure to work, the latest bit must be loaded into FIFO latch 0 (shown as item 1208) if data has been captured on a rising I/O clock edge, or FIFO latch 7 (shown as item 1224) if the data has been captured on a falling I/O clock edge.

After this gate count manipulation is done, the latest data bit or bits will be loaded with the first beat of the IAP pattern (beat 0, or the '1' of the 1 and 63 '0's pattern) in either the first FIFO latch or (FIFO 0, shown as item 1208) or last FIFO latch (FIFO 7 for elastic-8, shown as item 1224). Earlier data bits will be spread out in the three adjacent earlier FIFO latches such that the data is in four adjacent FIFO latches. By controlling the local select multiplexor, the position of the '1' of the IAP pattern can the be checked for each data bit. If a bit is in the same FIFO position as the latest data bit on the bus (FIFO 7, shown as item 1224), then no additional latch delay needs to be added to that bit. If it is one FIFO position earlier, (FIFO 7 when the latest bit is in FIFO 0, or FIFO 6 when the latest bit is in FIFO 7), then that bit can be delayed by one bit time to compensate by setting its "func_latch_delay_L1/L2" controls (shown as items 568 and 566 in FIG. 5) from 0 to 1, thereby adding one bit time of delay to the data when the normal functional data is passed through to the de-skewed L1/L2 sample (i.e., when not selecting the AND gates used to create the '1' and sixty-three '0' IAP pattern). Similarly, if any bit is found in an earlier FIFO latch, the func_latch_delay signals (shown as items 568 and 566 from FIG. 5) for that bit can be set to 2 or 3 to add the appropriate latch delays to line up all the data such that each beat of data for all bits in the clock/data group are loaded simultaneously into the same FIFO latch.

Figure 15:
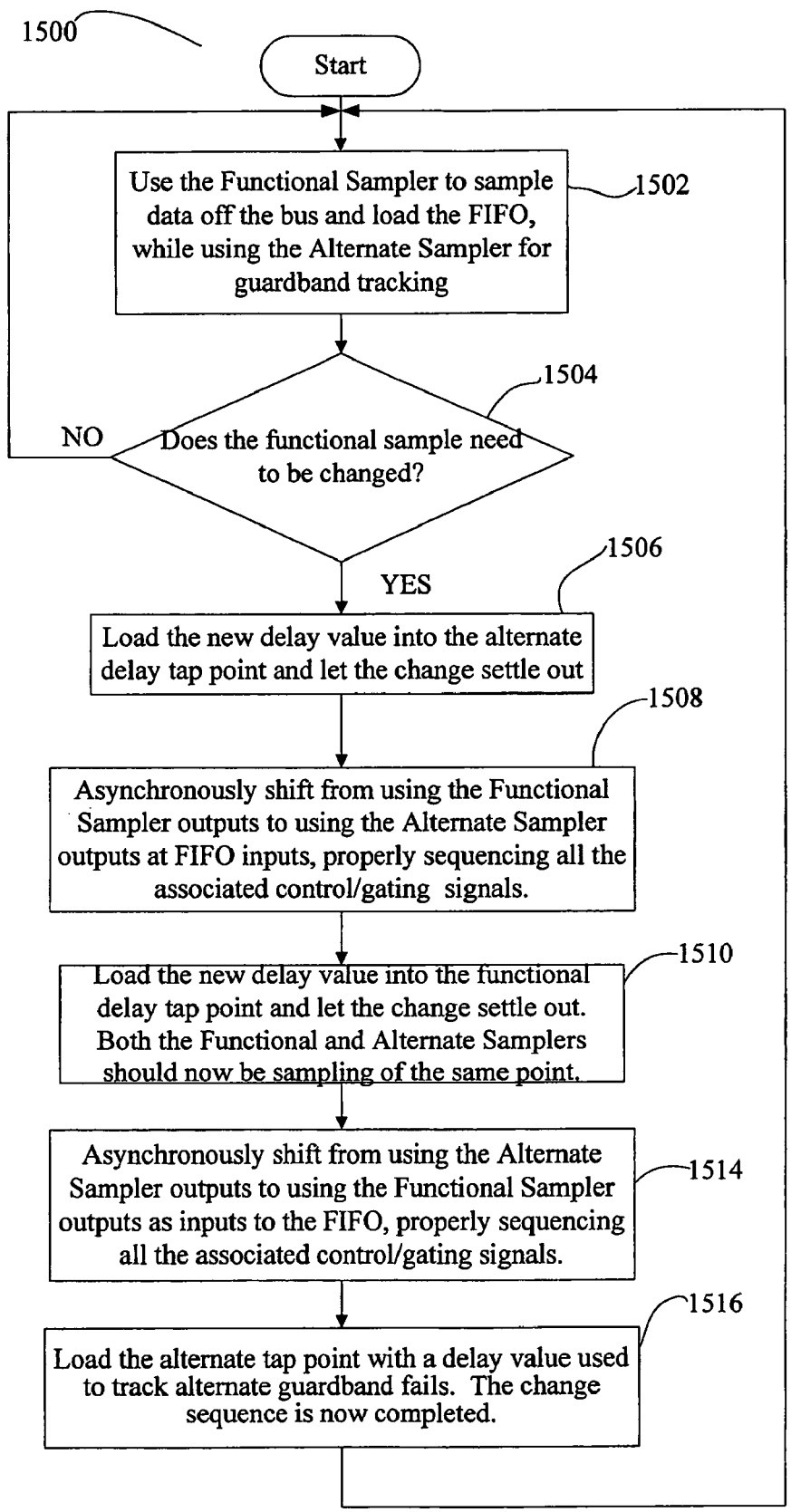
FIG. 15 is a flow diagram representing the operation of the glitchless delay update mechanism of the present invention.

Referring now to FIG. 15, methodology 1500 shows that in step 1502, the functional sampler logic (such as functional sampler 518 from FIG. 5) is used to sample data from the bus and forward the received data to the chip core logic. If the guardband tracking logic determines that the functional data sampling point needs to be changed (incremented or decremented) in step 1504, the update process proceeds to step 1506. In step 1506, the alternate sampler (such as alternate sampler 534 from FIG. 5) usually used to track an "alternate data eye", is loaded with the current (non-updated) functional delay value. Because of possible slow latches and delay decoding logic, this switch could take several bit times, causing bad data to be loaded into the alternate sampler latches for several cycle/bit times. Some small wait time is therefore used to let the alternate sampler delay values settle out such that the sampled data in the alternate sampler 534 is identical to that in the functional sampler 518. In step 1508, the multiplexor control which selects between the functional sampler and the alternate sampler being routed to the FIFO input latches (and thus eventually to the received data latch going to the chip core) is continuously changed from the functional to the alternate sampler. This can be asynchronous with a properly designed multiplexor because the two data inputs to the multiplexor have identical data/timing. In step 1510, with the switch made to using the alternate sampler 534 for the functional data, the functional delay value can now be changed to the updated value (usually by incrementing or decrementing the old value). As with the change to the alternate delay value, this process can cause glitching of the delayed data and consequently bad data could be loaded into the functional sampler latches for a few bit times as the delay value is updated. In step 1514, the multiplexor control which selects between the functional sampler and the alternate sampler being routed to the FIFO input latches (and thus eventually to the received data latch going to the chip core) is changed back from the alternate to the functional sampler. As with step 1510, this can be done asynchronously. In step 1516, the alternate sampler is then reloaded with its original "alternate eye" sampling point to resume its normal operation. The update process is then complete, with a return to the starting state, 1502, to await further updating requests.

Figure 16:
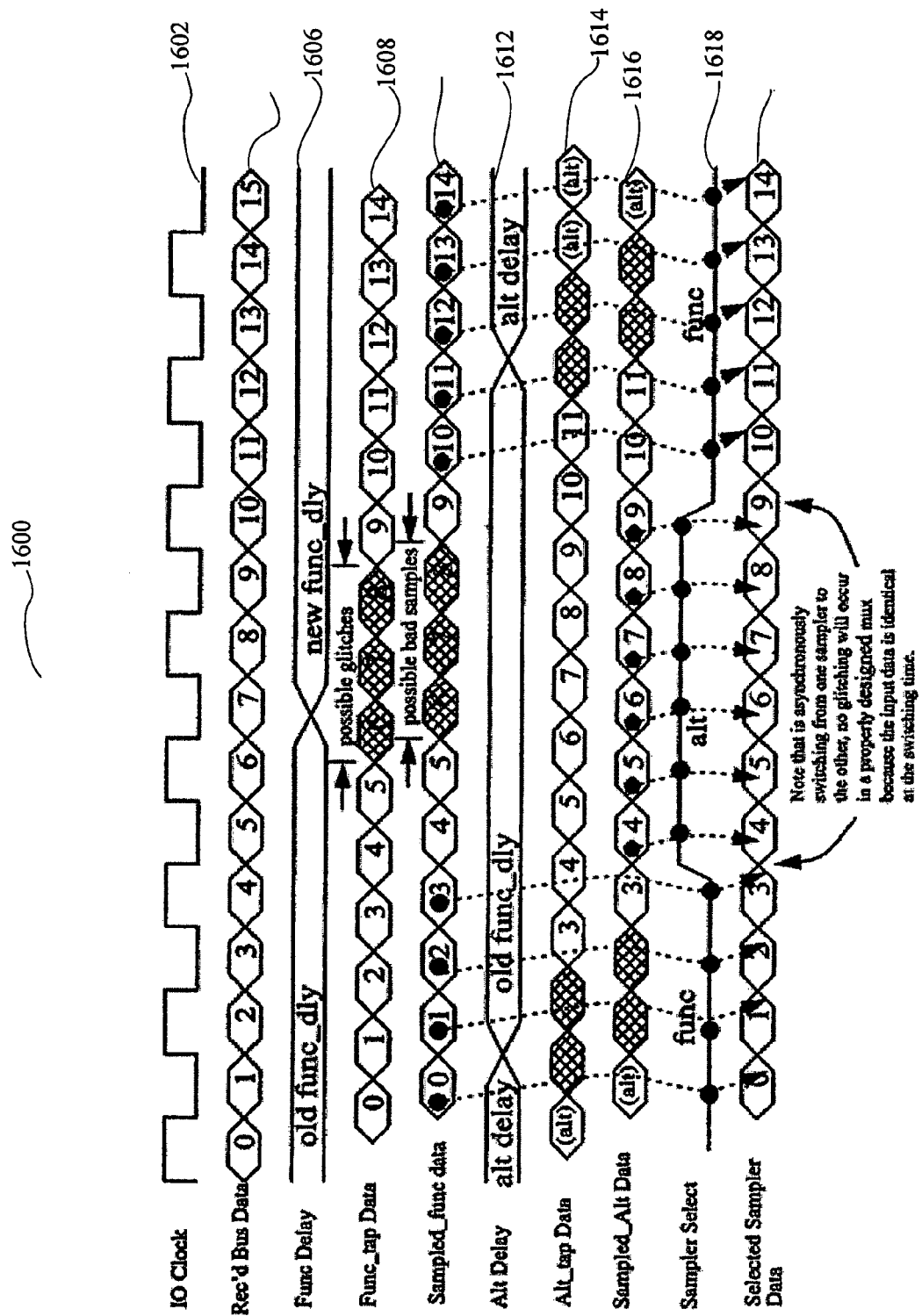
FIG. 16 is a timing diagram showing the operation of the glitchless delay update mechanism.

FIG. 16 illustrates timing diagram 1600 which details the above-described update operation (for the flow diagram in FIG. 15). As shown in timing diagram 1600, the functional data signal 1606 is sampled from the functional tap of the delay line (552 from FIG. 5) on every edge (both rising and falling) of the I/O clock signal 1602. The alternate delay signal 1612 is first changed (around beat 0), causing glitches on the alternate tap data (signal 1614) for a few bit times (around beat 1 and 2). Thereafter, the sampled alternate data (signal 1616) is identical to the functional data (signal 1608), and the sampler select (signal 1618) can switch to the alternate sampler (around beat 3 and 4). Thereafter, the functional delay value (signal 1606) can be updated to the new delay value (incremented or decremented) (around beat 7), which in turn can cause some glitches on the functional tap data (signal 1608) and consequently on the sampled functional data (around beats 6, 7, and 8). Thereafter the sampled functional data (signal 1608) and alternate sampled data (signal 1616), and the sampler select (signal 1618) can switch back to the functional sampler (around beat 9). The update of the functional sampler is then complete. Consequently, the alternate sampler can be changed back to its alternate delay value (around beat 12) and its normal tracking function is then resumed.

Figure 17:
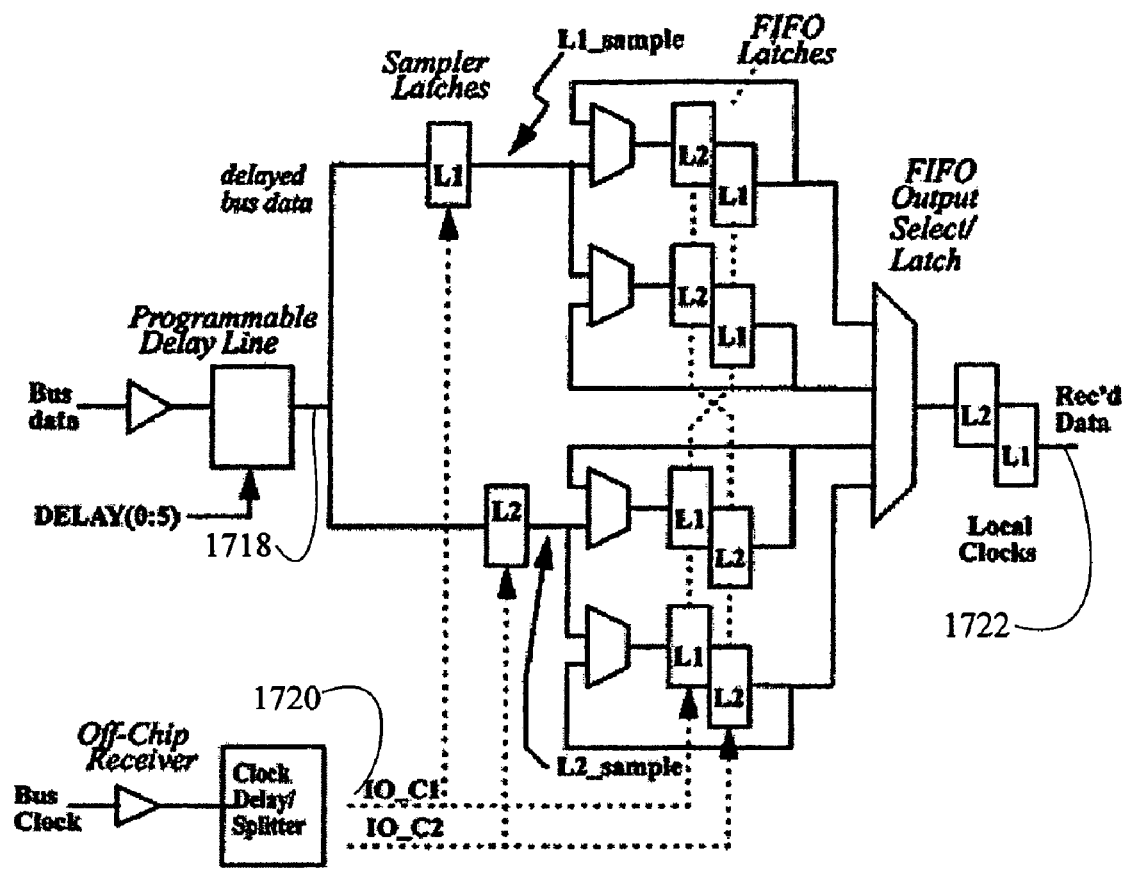
FIG. 17 is a block diagram of prior art illustrating the problems involved when delay updates cause glitches.

In some elastic interface systems, a single set of functional sampling latches are used to sample data from the bus, as shown in FIG. 17. As shown in FIG. 17, if, while sampling (latching) data from the delay line output 1718, the delay value is changed, there is a potential for glitches to appear briefly on the output of the delay line. Glitches may occur because of dynamic transitions of the delay controls in the delay line. If these glitches coincide with the capturing clock edge for the clock signals (such as clock signal 1720), erroneous data could be latched and forwarded to output 1722 and on to the end user of the data, causing data errors in the system.

In some elastic interface systems, this problem can be resolved by a substantial change in bus protocol. Specifically, when a data delay line such as delay line 1718 (FIG. 17) needs to be updated (to compensate for drift, for example), the functional data on the bus driver can be quiesced. The received data is fenced off from the I/O to the guts of the chip. The delay update can then be made, and any glitch-induced error from this process can be ignored by the fencing mechanism. When any possible glitching period is resolved, the receiver data is then un-fenced, and the driver is once again allowed to send functional data.

Referring again to FIG. 9, waveform 904 shows graphically how two adjacent beats of data might appear along a delay line at the moment the data is sampled (i.e., on either a rising or falling clock edge). In this example, a 48-step data delay line and an associated 16-step hold-time clock delay line are illustrated. In waveform 902, a single data "eye" is shown, for which data could be optimally sampled at the delay position "24" (point 904), with the valid eye extending roughly from delay position "16" (point 908) to delay position "31" (point 906). If the guardband delay value is set to 8, as shown, then the setup delay value, at position "31," will be on one edge of the data eye, and the hold-time delay, which is sampled by delaying the clock by 8 delay steps, effectively samples the data eye at the data delay time at point "16," which is at the other edge of the data eye. In such as situation as shown in waveform 902, this data eye could change in various ways. For example, the data eye could widen or shrink, such that the setup and hold sample points 906 and 908 could be either further inside or outside the data eye. Alternatively, the data eye could "drift" such that it was no longer centered at the functional sample shown at point 904 (position "24"). Therefore, it may be desirable to update the sample points. Normal updating of the three sample points may be made using the methodologies described below.

As a first case (Case 1), if no setup or hold-time guardband fails occur, (as indicated by no setup_fail or hold_fail guardband fail sticky latches being set, and bus activity has occurred, as indicated by the exp_r or exp_f guardband fail sticky latches being set, then the guardband delay should be increased. In waveform 902 in FIG. 9, this would have the effect of moving the setup sample point 906 from position "31" to position "32," while the hold sample at point 908 is decreased from position "16" to position "15."

As a second case (Case 2), if both setup and hold-time guardband fails occur (as indicated by both setup_fail and hold_fail guardband fail sticky bits being set), the guardband delay should be decreased. In waveform 902 in FIG. 9, this situation would occur if the setup sample point 906 were at position "32" and the hold-time sample point were at position "15," thus sampling in the "fuzz" or transitioning area of the data eye. Decreasing the guardband by one delay increment would then move the setup and hold sample points back into the data eye as illustrated in FIG. 9.

As a third case (Case 3), if only a setup guardband fail occurs (as indicated by only the setup_fail guardband fail sticky latch being set, this indicates that the data eye is not properly centered in the data eye, and is sampling at a tap point (sometimes referred to as a "position" herein) that is too "late" in the delay line. The functional sample point therefore should be decremented. In waveform 902 in FIG. 9, this would occur if the setup sample 906 fell outside the data eye. As shown in FIG. 9, if the beginning of the shaded "fuzz" data transition portion of the waveform started at position "31" instead of position "32" as illustrated. In the case illustrated, decrementing the functional sample point 904 from position "24" to position "23" will also decrease the setup sample point 906 from position "31" to position "30," and the hold sample point 908 from position "16" to position "15."

As a fourth case (Case 4), if only a hold-time guardband fail occurs (as indicated by only the hold_fail guardband fail stick latch being set, this also indicates that the data eye is not properly centered in the data eye. Hence, the functional sample point would occur at a tap point that is too "early" in the delay line. The functional sample point therefore should be incremented. In waveform 902, this would occur if the hold sample point 908 fell outside the data eye. This would occur if, as shown in FIG. 9, the beginning of the shaded "fuzz" data transition point of the waveform started at position "16" instead of position "15." In the case illustrated, incrementing the functional sample point 904 from position "24" to position "25" would increase the setup sample point 906 from position "31" to position "32," and the hold sample point 908 from position "16" to position "17."

If none of the Cases 1-4 listed above occur, the guardbands and functional sample point need not be changed. The method's net effect is to continually search for the "edges" of the data eye, as indicated by the setup and hold guardband fails. In a stable bus situation (no "drift" occurring in the data eye," the method may continually be increment or decrement functional sample point or guardband value, reaching an oscillating (but stable) state. As an example from FIG. 9, in waveform 902 the three sample points (at points 906, 904 and 908) shown would fall into Case 1, listed above (no guardband fails) and the guardband increased. This would cause the setup sample point 906 to move from position "31" to position "32," while the hold sample point would move from position "16" to position "15." After resetting the sticky guardband fail latches and allowing new fails to accumulate, Case 2 above might occur, in which both a setup and hold guardband fail occurs, with a resultant decrementing of the guardband value, returning the setup and hold tap point to the original values shown. The process would then repeat itself, alternating between Case 1 and Case 2. It is easy to see that a similar alternating process could occur between Cases 3 and 4. These processes serve to adjust the sample points to keep the data eye (or eyes) properly positioned with a delay line.

In the bottom illustration in FIG. 9, waveform 904 has two data eyes. The two data eyes represent two adjacent data beats on the bus and are present in the delay line at the moment of sampling (a rising or falling clock edge). As described earlier, a functional sample point F (point 918) along with corresponding setup sample points (shown with an "S" at point 920) and hold sample point (shown with an "H" at point 920) could be used to track a data eye, while simultaneously tracking the "edge" of an alternate data eye A' (shown at point 916). Alternatively, a functional sample point F' (point 910) along with corresponding setup sample S' (point 912) and hold sample point H', (point 914) could be used to track the "later" data eye, while simultaneously tracking the "edge" of the earlier data eye of eye A', at point 920. As described earlier, if at a given sampling clock edge "N", data beat "M" could be sampled at the functional sample tap point F (point 918), while a previous data beat "M−1" could be sampled at sample tap point F' (point 910). Similarly, data beat "M" sampled at sampling clock edge "N" using sample tap point F (point 918) could be sampled one clock edge later (clock edge "N+1") using sample tap point F' (point 910). This leads to the following additional possible sample point update cases:

A first additional possibility is that, as illustrated in waveform 904 (FIG. 9), if the functional sample point F (point 918) dropped to its minimum value of position "0," as shown, and a setup guardband fail occurred (because the data eye drifted such that setup sample point 918 was no longer in the data eye), the "decrement functional delay" operation detailed in Case 3 above no longer applies, in that the functional delay tap point cannot be less than the minimum of zero. In tracking the edge of the data eye's setup point, the guardband delay would therefore have to be decremented, as in Case 2, above, such that the setup sample point 920 is decremented to once again be in the data eye. If such drift continued, the data eye would continue to narrow as the guardband delay value is decremented, with the net result being that the functional sample point 918 would be closer, and closer to the edge of the data eye as the setup sample point 920 decreased. This would eventually cause functional sampling errors.

A second additional possibility is that, if in waveform 904 (FIG. 9), the "later" sample point F' (point 910) were being used as a functional sample point with the corresponding setup (point 912) and hold (point 914) sample points, and if the data eye 926 were to drift to larger sample tap points (data eye drifting to the left in FIG. 9), hold-time fails would occur and functional sample point would be incremented, as described in Case 4, above, to track the center of the data eye. If such drift continued, eventually the setup sample point S' (point 912) would reach the maximum value of the delay line at position "47" (point 916). With any further drift, the guardband delay value would need to be decremented, such that the hold position 914 could be incremented to keep it within the data eye.

In either of these cases, the sampling points end up "drifting" off the end of the delay line. This leads to the following recalibration update cases:

As a fifth case (Case 5), when the functional sample point F (point 918) reaches a minimum tap point of zero and setup fails occur, that same data can be sampled by switching to the alternate functional sample point, F' (point 910), and capturing that data one clock edge later. (as described above). This new F' sample point can be generated from the alternate edge sample point A at point 914, by adding the current guardband value to the tap point A. This can only be done, however, if the data, as sampled at the delay line tap point F (point 918) has been delayed by an additional bit time using the latches and mechanism as described earlier in FIG. 4. In using the alternate functional sample point F' (point 910), the added delay line-based bit time of delay can be compensated for by removing the added latch used when sampling using sample point F (point 918). If no additional latch were used in the de-skew process when sampling "early" in the data line point F (point 918), then a switch to the later tap point could not be made, because compensation for the added bit time of delay line-based delay could not be made. Furthermore, if the alternate edge A (point 914) delay tap value plus two guardband delays (the estimated width of the alternate data eye centered at point F, point 910) totaled to be greater that the largest tap of the delay line (position "47," point 916 in this implementation), it would indicate that that alternate data eye was also "drifting off the edge of the delay line" and therefore should not be switched to.

As a sixth case (Case 6), when the functional sample point F' (point 910) is used for sampling data from the bus, if the alternate data eye edge A' (point 920), "earlier" in the data delay line, is greater than the current guardband delay value, it indicates that the alternate data eye sample point F (point 918) may be in centered in a wider data eye. As such, a switch could be made from sampling at F' (point 910) to F (point 918). In so doing, the data will be sampled one bit time earlier, and, to compensate for this, an additional bit time of delay must be added using a delay latch as described in FIG. 4. This switch to an earlier data delay line sample point could not be made if the maximum amount of de-skew latches were already being used when sampling at point F' (point 910), in that no more de-skew latches are available to compensate for the decreased delay line tap point.

Cases 5 and 6 illustrate a data delay line "wrap-around" feature, which is a feature of an embodiment of the present invention. Such selection of two different sampling points in the delay line allows for dynamic compensation for drift in the delay line. This drift may be caused by normal voltage variations, temperature variations, or changing bus clock frequencies (intentional or unintentional). Without this wrap-around feature, if the functional data window were to drift to or beyond the end of the data delay line, the functional sample point would cease to be optimally centered in the data eye. As a result, the functional sample point might be at the edge of the data eye, causing sampling errors and thus functional data errors in the receiving "guts" of the chip.

Note that in making these delay line updates in any of the cases involving changing the functional sample point (Cases 3 through 6), the method of glitchless updating described earlier could be employed to avoid data sampling errors. Making updates only to the guardband sampling points (by incrementing or decrementing the guardband delay value without changing the functional delay value) would not require the "glitchless" updates, since glitches on the setup and hold sample points could easily be ignored by resetting the sticky setup/hold guardband fail latches after the update, prior to accumulation of new guardband fails.

The result of the "de-skew to closest clock edge" process described herein is that an optimal functional delay (func_dly) value is found for delaying data such that the data eye is centered on a sampling clock edge, as shown in FIG. 9. Associated with that functional delay value for that bit is a guardband delay value, (gb_dly), which effectively defines two additional sampling points, the setup delay (su_dly), and the hold-time delay (hold_dly). As shown in FIG. 1400, a 3-tap delay line can be used to track functional, setup, and hold-time sampling points for a single data eye (such as in waveform 902, FIG. 9). If an effective 6-tap delay line could be used, it would be possible to track the functional, setup, and hold-time sampling points for both the data eyes shown in waveform 904 (FIG. 9). However, a 6-tap delay line has disadvantages associated with cost, added silicon area, and added control logic. Methods that embody the present invention provide alternatives to using a 6-tap delay line to sample two data eyes. In an embodiment of the present invention, an alternate sampler is used (for example alternate sampler 534, FIG. 5) to track two data eyes. The two eyes can be referred to as a "functional tap based data eye" (data eye 928, FIG. 9) and an "alternate data eye" (data eye 926, FIG. 9). Regarding the alternate data eye 926, an embodied method tracks the edge of the alternate data eye 926 closest to the functional-tap based data eye 928. For example, in waveform 928 from FIG. 9, functional eye 928 is centered at the F position, at point 918, also shown as point "0." Regarding the alternate data eye 926, the alternate A/H' edge is shown at position 24 (point 914). The alternate eye's functional sample point (at point 910, in the middle of waveform 926)) does not have to be tracked because it can be estimated by adding one guardband value to the alternate sample tap value (at point 914). For example, the alternate data eye's 926 functional sample point can be estimated by A/H'+GB=F' (which yields 24+7=31). Similarly the alternate sampling window's setup sample point (at point 912) can be estimated as S'=A/H'+2×GB (which yields 24+2×14=38). The alternate sample point (A/H', at point 914) may be tracked using the guardband fail capture logic shown in FIG. 10. Its operation is shown in timing diagrams in FIGS. 15 and 16.

Figure 18:
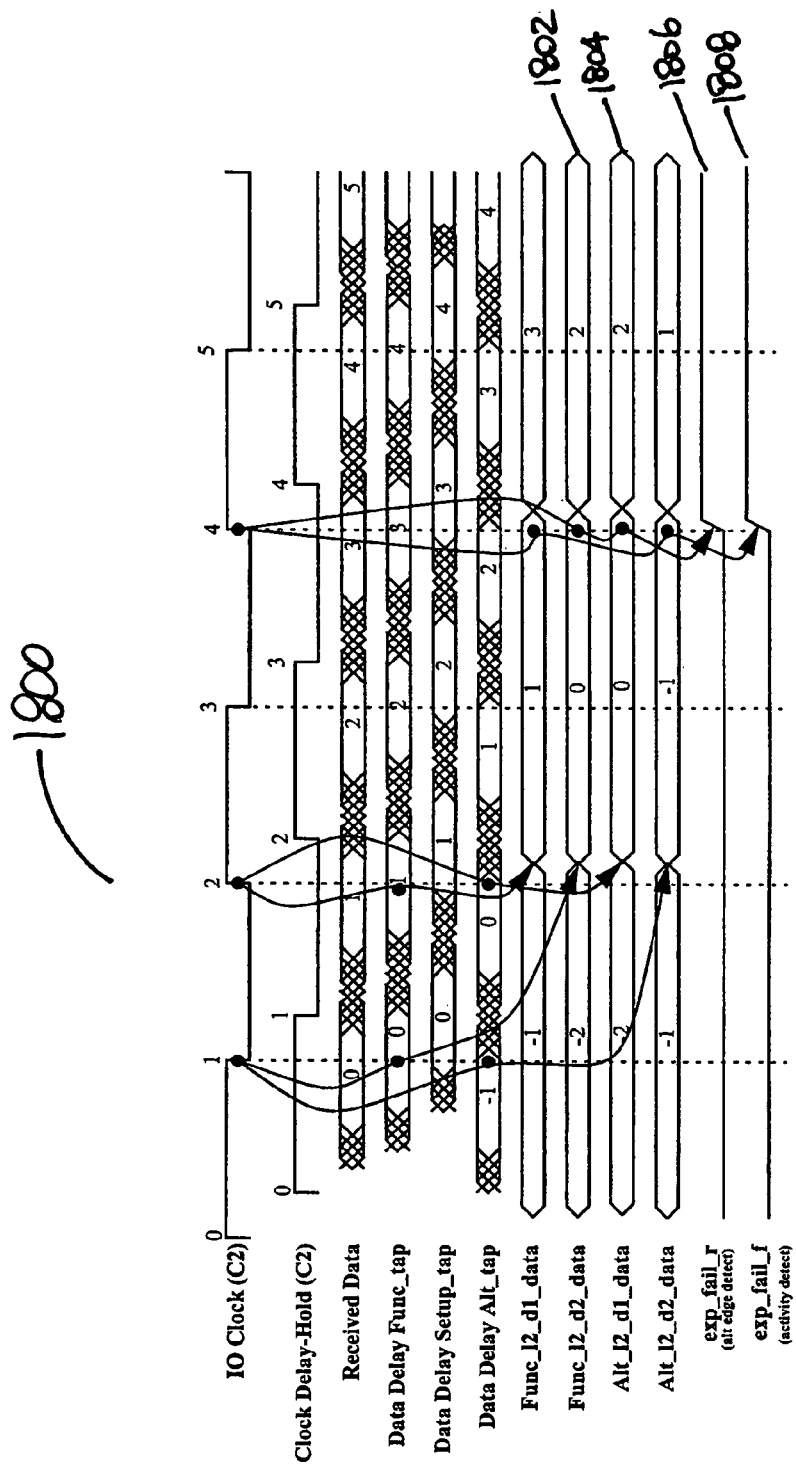
FIG. 18 illustrates waveforms associated with alternate eye tracking in a delay line in which the functional data eye is sampled earlier and the alternate data eye occurs later in the delay line.

FIG. 18 shows the case in which the functional data eye (for example, data eye 928, FIG. 9), which is sampled with the function tap of the delay line (for example, line 536, FIG. 5), has a small delay value. A small delay value indicates that the functional data eye (e.g., data eye 928) is being sampled "early" in the delay line (while the alternate data eye 926 is sampled "later" in the delay line). In this case, the alternate sampler (e.g., alternate sampler 534, FIG. 5) needs to track the hold time of the alternate data eye (e.g. alternate data eye 923). If the middle of the alternate data eye (e.g., at point 910) were sampled, it would be sampled at the F' location (e.g., at point 910) approximately one guardband value greater than the alternate hold-time sample at point 914. If an embodiment did not have enough taps in the delay line to track this alternate functional sample point (e.g., F' point, at point 910) However, it is not necessary to sample the alternate function sample point because it is sampled one clock edge earlier with the functional tap. This data need only be delayed by one bit time such that it can be compared with the alternate tap sample. Delaying the data can be accomplished using delay latches in the functional sampler logic, as illustrated in FIGS. 7 and 8. Thus, as shown in waveform set 1800 (FIG. 18), the one bit time-delayed functional sample latch output, func_12_d2 (signal 1802), is compared with the alternate sample, alt_12_d1 (signal 1804) to generate the sticky-latched "exp_fail_r" (signal 1806), which is set to logic 1 only when the F' sample and the H' samples mis-compare. A mis-compare between the F' sample and the H' samples indicate that this alternate hold time sample (e.g. at point 914 FIG. 9) is outside the alternate data window. Note that the other fail signal, "exp_fail_f" (signal 1808, FIG. 18) compares samples from two different data beats and should therefore have mis-compares. Therefore, in normal operation "exp_fail_f" would be set to logic 1 unless there was no activity of the data signal (i.e. if the received data were not changing, such as if it were stuck at 0 or stuck at 1) would this. Therefore, the exp_fail_f (signal 1808, FIG. 18) may serve as a bus activity indicator.

Figure 19:
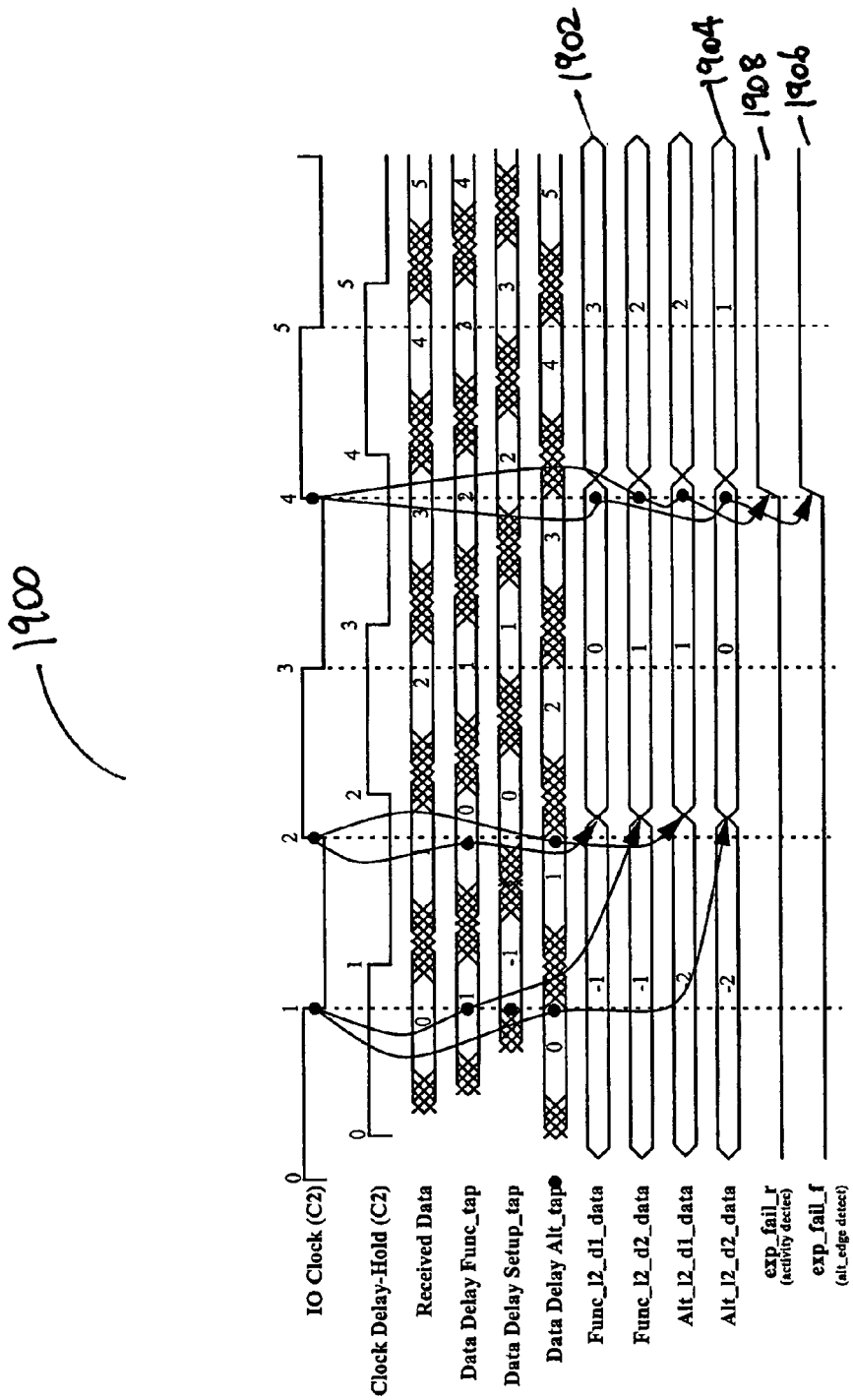
FIG. 19 illustrates waveforms associated with alternate eye tracking in a delay line in which the functional data eye is sampled later and the alternate data eye occurs earlier.

FIG. 19 illustrates a case in which the functional data eye (for example, data eye 928 from FIG. 9)) has a large delay value. A large delay value in the functional data eye indicates that the functional data eye is being sampled "late" in the delay line. Therefore, tracking an alternate data eye would be sampled "earlier" in the delay line. Although not illustrated in FIG. 9, an illustration of this case would result in alternate data eye 926 and functional data eye 928 swapping positions in waveform 904. In this case, the alternate sampler (e.g. alternate sampler 534 from FIG. 5) would track the setup time of the alternate eye, at position 920 in FIG. 9. The functional data window would have its F sampling point centered on position "31" at point 910, while the alternate data eye would be sampled on the "0" position at point 918. Therefore, the alternate data eye would have its setup sample(S/A') at position 7 shown at point 920. The alternate tap (for example alternate tap 534 from FIG. 5) would be used to track the setup sample at position 7 shown at point 920. As with the case shown in FIG. 18, the center of the alternate data eye is not sampled directly, but has been sampled one bit time earlier with the functional tap at the F' point. Therefore, by delaying the alternate sample point by one bit time relative to the functional sample point, the alternate data eye's centered value can be compared with its setup sample, by comparing the func_12_d1 (signal 1902, FIG. 19) and alt_12_d2 signal (signal 1904, FIG. 19), to generate the sticky-latched "exp_fail_f" signal (signal 1906, FIG. 19). The exp_fail_f signal (signal 1906, FIG. 19) is set to logic 1 when the setup sample point for the alternate data window is outside the data window. The exp_fail_r signal (signal 1908) is an indicator of signal activity because it samples different beats of data on the bus.

Note the different comparison operations, depending on the relative locations of the functional and alternate data eyes in the delay line. Either the exp_fail_r or exp_fail_f signal is monitored for an indication of being in or out of the data eye. The unused exp_fail signal can, in both cases, serve as an indicator of signal activity on the bus. Thus, with normal, somewhat random-looking data on the bus, one of the exp_fail signals will indicate whether the sample point is inside or outside the data window, while the other indicates that the signal has some transitions during the guardband fail accumulation period. If this exp_fail "activity" indicator is not set after an guardband fail accumulation period, it indicates that the other exp_fail "fail" indicator is not a valid indicator of a the in-or-out-of-the-data-window condition, because the activity indicator being zero will dictate that no valid comparisons of data are made. In other words, there were no transitions in the data to track the guardband fails.

Although the present invention and its advantages have been described in detail, it should be understood that various changes, substitutions and alterations can be made herein without departing from the spirit and scope of the invention as defined by the appended claims.

What is claimed is:

1. A method for glitchless delay value updating in an elastic interface system, the method comprising the steps of:
   sampling a data bit off a data bus by a functional sampler, wherein the data bit is loaded from a functional sampler output into a FIFO input;
   tracking a guardband characteristic using an alternate sampler;
   determining whether a functional sample point needs to be adjusted, wherein changing a delay value from an old delay value to a new delay value results in adjusting the functional sample point;
   loading the old delay value into the alternate sampler; and
   temporarily ceasing to load the data bit from the functional sampler output into the FIFO input and, instead, loading the data bit from an alternate sampler output to the FIFO input.

2. The method of claim 1, the method further comprising the steps of:
   loading the new delay value into the alternate sampler; and resuming the loading of the data bit from the functional sampler output into the FIFO input.

3. The method of claim 2, wherein the new delay value is used to track alternate guardband fails.

4. The method of claim 1, wherein the step of temporarily ceasing to load the data bit from the functional sampler output into the FIFO input occurs in response to an asynchronous signal.

5. The method of claim 1, wherein the data bit is loaded from the functional sampler output into the FIFO input through one or more multiplexors, wherein the data bit is loaded from the alternate sampler output to the FIFO input through the one or more multiplexors.

6. A circuit for performing de-skewing of a plurality of data bits within a clock/data group, wherein the circuit comprises:
   a data receiver for receiving the plurality of data bits;
   a programmable delay line, wherein the programmable delay line comprises a functional tap for providing a functional delayed signal, wherein the functional delayed signal is a delayed version of one of the plurality of data bits, wherein a functional sampling value is used for determining a functional sampling point, wherein the programmable delay line comprises an alternate tap for providing an alternate delayed signal, wherein the alternate delayed signal is a delayed version of one of the plurality of data bits, wherein an alternate sampling value is used for determining an alternate sampling point;
   a multiplexor for alternately outputting either the functional delayed signal or the alternate delayed signal in response to a control signal;
   first circuitry for determining whether to change the functional sampling value;
   second circuitry for temporarily making the alternate sampling value equal to the functional sampling value, wherein the second circuitry changes the control signal to result in the multiplexor outputting the alternate delayed signal;
   third circuitry for incrementing or decrementing the functional sampling value; and
   fourth circuitry for changing the control signal to result in the multiplexor outputting the functional delayed signal after the functional sampling value is incremented or decremented.

7. The circuit of claim 6 for performing de-skewing of a plurality of data bits within a clock/data group, the circuit further comprising:
   fifth circuitry for restoring an old value to the alternate sampling value after the multiplexor outputs a functional delayed signal that results from an incremented or decremented functional sampling value.

8. The circuit of claim 6 for performing de-skewing of a plurality of data bits within a clock/data group, the circuit further comprising:
   a set of level sensitive latches for latching the functional delayed signal.

9. The circuit of claim 6 for performing de-skewing of a plurality of data bits within a clock/data group, the circuit further comprising:
   a setup sampler; and
   a hold-time sampler.

10. The circuit of claim 6 for performing de-skewing of a plurality of data bits within a clock/data group, the circuit further comprising:
    logic circuitry for identifying a unique sequence in an IAP pattern.

11. A method for finding an alternate data eye within a delay line in an elastic interface system, the method comprising the steps of:
    identifying a functional sample point;
    identifying a setup guardband of a functional data eye;
    identifying a hold-time guardband of the functional data eye;
    determining whether a functional data eye occurs early in a data eye or late in a data eye by comparing the functional sample point to a threshold value;
    if the functional data eye occurs early in the delay line, setting an alternate delay value to the value of the setup guardband of the functional data eye; and
    if the functional data eye occurs late in the delay line, setting the alternate delay value to the value of the hold-time guardband of the functional data eye.

12. The method of claim 11 further comprising the steps of:
    determining whether an alternate sample point is outside an alternate data eye;
    if the alternate sample point is outside the alternate data eye, decrementing the alternate delay value;
    if the alternate sample point is inside the alternate data eye, incrementing the alternate delay value to allow tracking an edge of the alternate data eye.

13. The method of claim 12 further comprising the steps of:
    accumulating instances of mis-compares an edge of an alternate data eye;
    setting a mis-compare variable if a second threshold value is reached, wherein the second threshold value is a count including accumulated instances of mis-compares on the edge of the alternate data eye.

14. The method of claim 13, wherein an alternate data eye is tracked using a delay tap point from a delay line used for sampling a functional data eye.

15. A method of performing wraparound sampling in a delay line coupled to an elastic interface bus, the method comprising the steps of:
    taking a first functional sample of a data bit stored in a data delay line, wherein a functional sample location is influenced by a functional delay value;
    storing an alternate delay value, wherein the alternate delay value influences an alternate sample location, wherein the alternate sample is performed by an alternate sampler;
    adding a guardband delay to the alternate delay value to result in a second functional delay value;
    taking a first functional sample, wherein the second functional delay value influences the position of the first functional sampler.

16. The method of claim 15, wherein the first functional sample bypasses a delay element, wherein the first functional sample is used as a functional sample point in place of a sample point by a functional sampler that has drifted off the data delay line.

17. The method of claim 16, wherein the delay element is a latch, wherein the latch causes a bit time of delay.

* * * * *